(12) United States Patent
Adachi et al.

(10) Patent No.: US 9,812,594 B2
(45) Date of Patent: Nov. 7, 2017

(54) SOLAR CELL AND METHOD OF MANUFACTURE THEREOF, AND SOLAR CELL MODULE

(71) Applicant: KANEKA CORPORATION, Osaka-shi, Osaka (JP)

(72) Inventors: Daisuke Adachi, Settsu (JP); Kenji Yamamoto, Settu (JP); Jose Luis Hernandez, Brussels (BE); Nick Valckx, Brussels (BE)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 14/997,404

(22) Filed: Jan. 15, 2016

(65) Prior Publication Data
US 2016/0133765 A1    May 12, 2016

Related U.S. Application Data

(63) Continuation of application No. 13/983,553, filed as application No. PCT/JP2012/070401 on Aug. 9, 2012, now Pat. No. 9,246,026.

(30) Foreign Application Priority Data

Nov. 22, 2011 (JP) ................... 2011-255362
Feb. 6, 2012 (JP) ................... 2012-023118
Feb. 29, 2012 (JP) ................... 2012-044179

(51) Int. Cl.
*H01L 31/00* (2006.01)
*H01L 31/0224* (2006.01)
*H01L 31/0445* (2014.01)

(52) U.S. Cl.
CPC ............ *H01L 31/022475* (2013.01); *H01L 31/022425* (2013.01); *H01L 31/0445* (2014.12); *Y02E 10/542* (2013.01); *Y02P 70/521* (2015.11)

(58) Field of Classification Search
CPC ............................................. H01L 31/022425
See application file for complete search history.

(56) References Cited

U.S. PATENT DOCUMENTS 4,586,988 A    5/1986 Nath et al.
5,380,371 A    1/1995 Murakami
(Continued)

FOREIGN PATENT DOCUMENTS

CH    WO 2011045287 A1 *  4/2011    ..... H01L 31/022425
JP        S6066426 A        4/1985
(Continued)

OTHER PUBLICATIONS

JP 2009123607, 2009, machine translation.*
(Continued)

*Primary Examiner* — Robert Vetere
(74) *Attorney, Agent, or Firm* — Alleman Hall Creasman & Tuttle LLP

(57) ABSTRACT

Disclosed is a solar cell having a collecting electrode on one main surface of a photoelectric conversion section. The collecting electrode includes a first electroconductive layer and a second electroconductive layer in this order from the photoelectric conversion section side, and further includes an insulating layer between the first electroconductive layer and the second electroconductive layer. The first electroconductive layer includes a low-melting-point material, and a part of the second electroconductive layer is conductively connected with the first electroconductive layer through, for example, an opening in the insulating layer. The second
(Continued)

electrode layer is preferably formed by a plating method. In addition, it is preferable that before forming the second electroconductive layer, annealing by heating is carried out to generate the opening section in the insulating layer.

10 Claims, 7 Drawing Sheets

(56) References Cited

U.S. PATENT DOCUMENTS

| | | |
|---|---|---|
| 2003/0080436 A1 | 5/2003 | Ishikawa |
| 2011/0045627 A1 | 2/2011 | Sachs et al. |
| 2012/0291844 A1 | 11/2012 | Tsuge |

FOREIGN PATENT DOCUMENTS

| | | | |
|---|---|---|---|
| JP | H0563218 A | | 3/1993 |
| JP | H0878074 A | | 3/1996 |
| JP | 2000058885 A | | 2/2000 |
| JP | 2005142330 A | | 6/2005 |
| JP | 2009123607 A | * | 6/2009 |
| JP | 2010098232 A | | 4/2010 |
| JP | 2011199045 A | | 10/2011 |
| WO | 2011045287 A1 | | 4/2011 |

OTHER PUBLICATIONS

Xia, Y. et al., "Pattern Transfer: Self-Assembled Monolayers as Ultrathin Resists," Microelectronic Engineering, vol. 32, No. 1-4, Sep. 1996, 14 pages.

Nguyen, A. et al., "Feasibility of Improving Front Metallization Lines for Photovoltaic Devices," 34th IEEE Photovoltaic Specialists Conference (PVSC 2009), Jun. 7, 2009, 4 pages.

ISA Japanese Patent Office, International Search Report Issued in Application No. PCT/JP2012/070401, dated Oct. 16, 2012, WIPO, 1 page.

Japanese Patent Office, Notice of Allowance Issued in Japanese Patent Application No. 2012-557326, dated Jun. 25, 2013, 6 pages.

International Bureau of WIPO, International Preliminary Report on Patentability Issued in Application No. PCT/JP2012/070401, dated Jun. 5, 2014, WIPO, 6 pages.

* cited by examiner before annealing
(after printing)          after annealing before sintering after sintering onset
(initial sintering stage)

after sintering onset

SOLAR CELL AND METHOD OF MANUFACTURE THEREOF, AND SOLAR CELL MODULE

CROSS REFERENCE TO RELATED APPLICATIONS

This application is a continuation of U.S. patent application Ser. No. 13/983,553, entitled SOLAR CELL AND METHOD OF MANUFACTURE THEREOF, AND SOLAR CELL MODULE, filed Aug. 2, 2013, which is the U.S. National Phase of International Patent Application No. PCT/JP2012/070401, entitled SOLAR CELL, MANUFACTURING—THEREOF, AND SOLAR CELL MODULE, filed Aug. 9, 2012, which in turn claims priority to Japanese Patent Application Nos. 2012-044179, filed Feb. 29, 2012; 2012-023118, filed Feb. 6, 2012; and 2011-255362, filed Nov. 22, 2011. Each of these applications is hereby incorporated by reference in its entirety for all purposes.

TECHNICAL FIELD

The present invention relates to a solar cell and a method of manufacture thereof. Further, the present invention relates to a solar cell module.

BACKGROUND ART

Since energy issues and global environmental issues are becoming more serious, solar cells are receiving more attention as an alternative energy for replacing fossil fuels. In the solar cell, carriers (electrons and holes) generated by light irradiation to a photoelectric conversion section composed of a semiconductor junction or the like are extracted to an external circuit to generate electricity. A collecting electrode is provided on the photoelectric conversion section of the solar cell for efficiently extracting carriers generated at the photoelectric conversion section to the external circuit.

For example, in a crystalline silicon-based solar cell using a single-crystal silicon substrate or a polycrystalline silicon substrate, a collecting electrode made of a slender metal is provided on a light receiving surface. Also, in a heterojunction solar cell having amorphous silicon layers and transparent electrode layers on a crystalline silicon substrate, collecting electrode(s) are provided on the transparent electrode layer(s).

In a silicon-based thin-film solar cell using an amorphous silicon thin-film, a crystalline silicon thin-film or the like, and a thin-film solar cell such as a compound solar using CIGS, CIS or the like, an organic thin-film solar cell or a dye-sensitized solar cell, a transparent electrode layer is provided on a surface of a photoelectric conversion section on the light receiving surface side in order to reduce the surface resistance of the light receiving surface. In this configuration, the transparent electrode layer can perform a function as a collecting electrode, and therefore in principle, it is not necessary to specially provide a collecting electrode. However, since conductive oxide, such as indium tin oxide (ITO) or zinc oxide, forming the transparent electrode layer has a resistivity higher than that of metal, there is such a problem that the internal resistance of the solar cell increases. Thus, a collecting electrode (metal electrode as an auxiliary electrode) is provided on the surface of the transparent electrode layer to improve current extraction efficiency.

The collecting electrode of the solar cell is generally formed by pattern-printing a silver paste by a screen printing method. This method is simple in terms of the process itself, but has such a problem that the material cost of silver is high, and that the resistivity of the collecting electrode increases because a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading loss by the collecting electrode increases.

For solving these problems, a method is known in which a collecting electrode is formed by a plating method excellent in terms of material and process costs. For example, Patent Documents 1 to 3 disclose a solar cell method in which a metallic layer made of copper or the like is formed by a plating method on a transparent electrode that forms a photoelectric conversion section. In this method, first, a resist material layer (insulating layer) having an opening section matching the shape of a collecting electrode is formed on the transparent electrode layer of the photoelectric conversion section, and a metallic layer is formed at the resist opening section of the transparent electrode layer by electroplating. Thereafter, the resist is removed to form a collecting electrode having a predetermined shape.

Patent Document 3 discloses that the line width of a plating electrode is made equal to or less than that of an under-layer electrode by forming the plating electrode layer using a mask after a formation of the under-layer electrode. In addition, Patent Document 3 discloses that a plating solution deposited on a substrate is washed off by water after a plating step, an organic solvent or the like, in view of the problem that solar cell characteristics are degraded if the solar cell, on which a plating solution remains, is exposed under a high-temperature and high-humidity environment.

Non-Patent Document 1 discloses a method in which a metallic pattern is formed by using a self-assembled monolayer as a very thin resist, and describes an electroplating method as one of the methods for forming a metallic pattern.

Patent Document 4 proposes a method in which a passivation layer (insulating layer) made of a polymer resin is formed on a transparent electrode layer, and a collecting electrode composed of an under-layer electrode made of an electroconductive paste and a metallic layer is formed thereon, wherein the metallic layer is formed on the under-layer electrode by electroplating. In this method, the passivation layer is partially dissolved by a solvent and a monomer component contained in the paste during formation of the under-layer electrode, so that an electrical contact is obtained between the transparent electrode and the collecting electrode. Since the under-layer electrode is formed on the insulating layer, shunts and short circuits due to contact of a defect portion of a semiconductor layer with the under-layer electrode are prevented.

As another method for forming a collecting electrode, Non-Patent Document 2 proposes a method in which an insulating layer made of silicon nitride or the like is formed on the surface of a crystalline silicon-based solar cell, and thereafter a silver paste is pattern-printed by a screen printing method and fired at a high temperature. In this method, since the silver paste is fired at a high temperature, the insulating layer is melted, so that electrical contact is obtained between silver particles in the silver paste and crystalline silicon.

PRIOR ART DOCUMENTS

Patent Documents

Patent Document 1: JP-60-66426
Patent Document 2: JP-A-2000-58885

Patent Document 3: JP-A-2010-98232
Patent Document 4: JP-5-63218

Non-Patent Documents

Non-Patent Document 1: Y. Xia et al., Microelectronic Engineering, vol. 32, page 255, 1996
Non-Patent Document 2: A. Nguyen et al., 35th IEEE Photovoltaic Specialist Conference, 2009

SUMMARY OF THE INVENTION

Problems to be Solved by the Invention

In the methods in Patent Documents 1 to 3, a resist material is required for forming a collecting electrode of a thin line pattern. The resist material is not only expensive but also has such a problem that manufacturing costs are significantly increased because the process for forming the electrodes is complicated by an underlying layer forming step, a resist removing step and so on for performing plating. In addition, there is such a problem that a transparent electrode layer has a high resistivity, and therefore when a pattern collecting electrode composed of a metal electrode layer is formed on the transparent electrode layer by electroplating without providing an under-layer electrode, the thickness of the collecting electrode (metal electrode layer) becomes non-uniform due to a voltage drop at the inner surface of the transparent electrode layer. Use of a mask matching a collecting electrode pattern as in Patent Document 3 has such a problem that it is not feasible for practical use because expenses and man-hours for preparing the mask are required.

A method using a monomolecular film as in Non-Patent Document 1 is considered to be difficult to apply to a solar cell having an unevenness on the surface for light confinement. That is, in the solar cell, "light confinement" is performed in which an uneven structure is formed on the light incident side of a photoelectric conversion section to scatter light, whereby the light path length is increased, but it is considered difficult to uniformly form a monomolecular film on the uneven structure, and a monomolecular film alone may not adequately function as a resist.

A method of dissolving a part of a passivation layer as in Patent Document 4 has such a problem that it is difficult to sufficiently reduce a contact resistance between a transparent electrode layer and a collecting electrode. The method described in Non-Patent Document 2 has such a problem that a thin-film that forms a photoelectric conversion layer is degraded or the resistance of a transparent electrode layer is increased because a high-temperature (e.g. 700 to 800° C.) process for firing a silver paste is required. Particularly, in a solar cell having an amorphous silicon-based thin-film, like a thin-film solar cell or a heterojunction solar cell, the conversion characteristic tends to be significantly reduced due to a high-temperature process for firing.

It is an object of the present invention to improve conversion efficiency of the solar cell and reduce manufacturing costs of the solar cell by solving problems of the prior art associated with formation of a collecting electrode of the solar cell as described above.

Means for Solving the Problems

As a result of conducting vigorous studies in view of the aforementioned problems, it is found that conversion efficiency of a crystalline silicon-based solar cell can be improved by using a specified collecting electrode, and further the collecting electrode can be formed at low costs, thus leading to the present invention.

Specifically, the present invention relates to a solar cell, including; a photoelectric conversion section; and a collecting electrode on one main surface of the photoelectric conversion section. The collecting electrode of the solar cell includes a first electroconductive layer and a second electroconductive layer in this order from the photoelectric conversion section side, and further includes an insulating layer between the first electroconductive layer and the second electroconductive layer. The first electroconductive layer includes a low-melting-point material, and a part of the second electroconductive layer is conductively connected with the first electroconductive layer.

In one embodiment, the solar cell of the present invention is a crystalline silicon-based solar cell (heterojunction solar cell) in which the photoelectric conversion section includes a silicon-based thin-film and a transparent electrode layer in this order on one main surface of a crystalline silicon substrate of a first conductivity type, and the collecting electrode is provided on the transparent electrode layer.

In one embodiment, the solar cell of the present invention is a crystalline silicon-based solar cell in which the photoelectric conversion section includes a diffusion layer of an opposite conductivity type on one main surface of the crystalline silicon substrate of the first conductivity type, and the collecting electrode is provided on the diffusion layer.

In one embodiment, the solar cell of the present invention is a thin-film solar cell in which the photoelectric conversion section includes a transparent electrode layer on one main surface of a pn junction or a pin junction of a semiconductor thin-film, and the collecting electrode is provided on the transparent electrode layer.

In the present invention, the thermal-fluidization onset temperature $T_1$ of the low-melting-point material of the first electroconductive layer is lower than the heat-resistant temperature of the photoelectric conversion section. For example, in a heterojunction solar cell, the thermal-fluidization onset temperature $T_1$ of the low-melting-point material is preferably lower than the heat-resistant temperature of a transparent electrode layer that forms the photoelectric conversion section, i.e. lower than 250° C. The low-melting-point material is preferably electroconductive, and preferably includes a metallic material.

In one embodiment of the present invention, the first electroconductive layer includes a high-melting-point material having a thermal-fluidization onset temperature $T_2$ higher than the thermal-fluidization onset temperature $T_1$ of the low-melting-point material.

In one embodiment of the present invention, the second electroconductive layer is conductively connected with the first electroconductive layer through an opening section of the insulating layer.

In one embodiment of the present invention, the insulating layer is also formed on a first electroconductive layer-non-formed region of the photoelectric conversion section. In addition, a contact angle θ of the surface of the insulating layer with water is preferably 20° or more. In one embodiment, a water-repellent treatment is performed, so that the contact angle of the surface of the insulating layer with water is set within above range.

Further, the present invention relates to a solar cell module including the aforementioned solar cell.

Furthermore, the present invention relates to a method of manufacture the solar cell with the aforementioned features.

The manufacturing method of the present invention includes: a first electroconductive layer forming step of forming a first electroconductive layer including a low-melting-point material on the photoelectric conversion section; an insulating layer forming step of forming an insulating layer on the first electroconductive layer; an annealing step of heating the first electroconductive layer; and a plating step of forming a second electroconductive layer by a plating method, in this order. According to the manufacturing method of the present invention, heating in an annealing step causes thermal fluidization in the low-melting-point material, so that the insulating layer formed thereon is deformed. Thus, in the plating step, the second electroconductive layer can be deposited at a deformed section, generated in the insulating layer in the plating step, as an origination point. This deformed section is preferably an opening section.

In the manufacturing method of the present invention, heating is carried out in an annealing step, preferably at an annealing temperature Ta that is higher than the thermal-fluidization onset temperature $T_1$ of the low-melting-point material. The annealing temperature Ta is preferably lower than the heat-resistant temperature of the photoelectric conversion section. When the first electroconductive layer includes a high-melting-point material having a thermal-fluidization onset temperature $T_2$, the annealing temperature Ta preferably satisfies $T_1<Ta<T_2$.

In one embodiment of the manufacturing method of the present invention, a water-repellent treatment step is further carried out before carrying out the annealing step. The water-repellent treatment is preferably carried out over the insulating layer after the insulating layer forming step is carried out.

Effects of the Invention

According to the present invention, a collecting electrode can be formed by a plating method, and therefore the collecting electrode is made less resistive, so that conversion efficiency of a solar cell can be improved. The method for forming a collecting electrode by a plating method in the prior art requires a patterning process for an insulating layer. According to the present invention, on the other hand, a pattern electrode can be formed by a plating method without using a mask or a resist for pattern formation. Thus, a solar cell having high efficiency can be provided inexpensively.

BRIEF DESCRIPTION OF THE DRAWINGS

FIGS. 8A1, 8A2, and 8B are conceptual views for explaining a method for measuring a contact angle.

DESCRIPTION OF EMBODIMENTS

Figure 1:
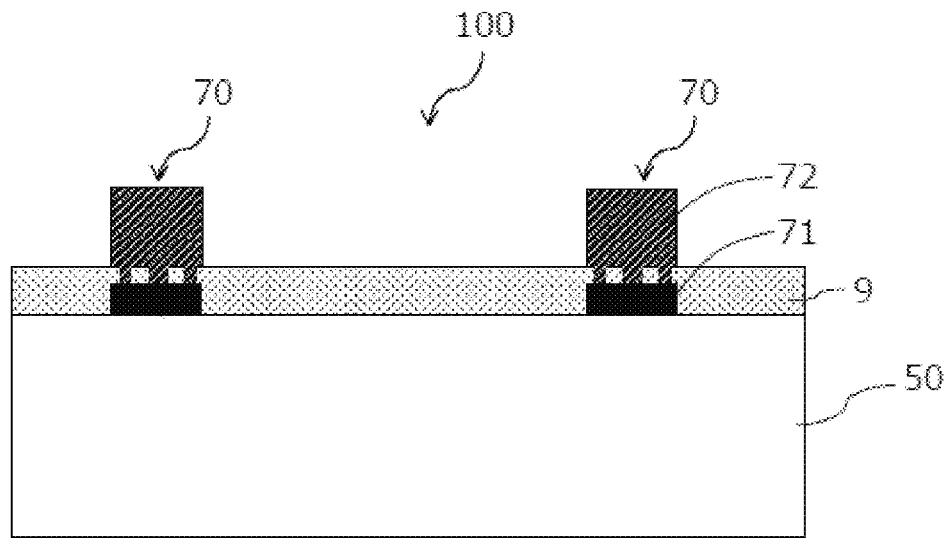
FIG. 1 is a schematic sectional view showing a solar cell of the present invention.

As schematically shown in FIG. 1, a solar cell 100 of the present invention includes a collecting electrode 70 on one main surface of a photoelectric conversion section 50. The collecting electrode 70 includes a first electroconductive layer 71 containing a low-melting-point material, and a second electroconductive layer 72 in this order from the photoelectric conversion section 50 side. An insulating layer 9 is formed between the first electroconductive layer 71 and the second electroconductive layer 72. A part of the second electroconductive layer 72 is conductively connected with the first electroconductive layer 71 via, for example, an opening section 9h of the insulating layer 9. The low-melting-point material of the first electroconductive layer 71 preferably has a thermal-fluidization onset temperature $T_1$ lower than the heat-resistant temperature of the photoelectric conversion section 50. The thermal-fluidization onset temperature $T_1$ is, for example 250° C. or lower.

The present invention will be described more in detail below taking as an example a heterojunction crystalline silicon solar cell (hereinafter, referred to as a "heterojunction solar cell" in some cases) as one embodiment of the present invention. The heterojunction solar cell is a crystalline silicon-based solar cell in which a silicon-based thin-film having a band gap different from that of a single-crystal silicon is formed on a surface of a crystalline silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is known as one configuration of crystalline silicon solar cell with highest conversion-efficiency.

Figure 2:
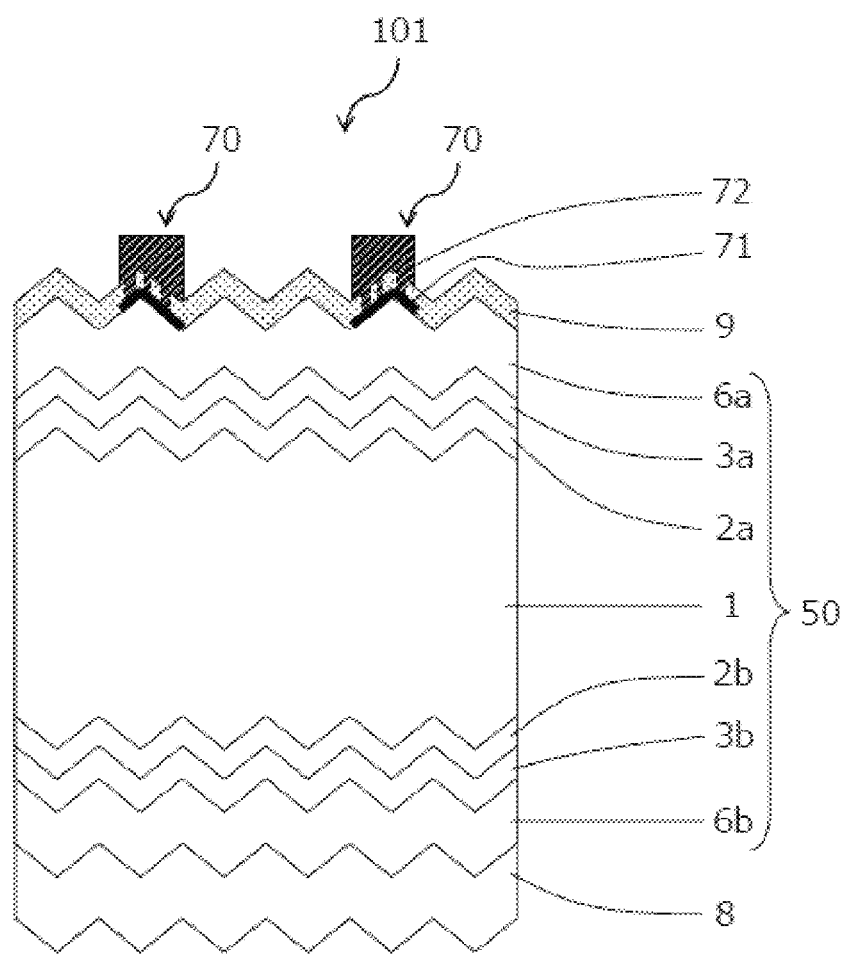
FIG. 2 is a schematic sectional view showing a heterojunction solar cell according to one embodiment.

FIG. 2 is a schematic sectional view of a crystalline silicon-based solar cell according to one embodiment of the present invention. A crystalline silicon-based solar cell 101 includes, as a photoelectric conversion section 50, a conductive silicon-based thin-film 3a and a light incident side transparent electrode layer 6a in this order on one surface (surface on the light incident side) of a single-crystal silicon substrate 1 of a first conductivity type. A conductive silicon-based thin-film 3b and a back side transparent electrode layer 6b are preferably provided in this order on the other surface (surface on the back side) of the single-crystal silicon substrate 1 of the first conductivity type. A collecting electrode 70 including a first electroconductive layer 71 and a second electroconductive layer 72 is formed on the light incident side transparent electrode layer 6a of the surface of the photoelectric conversion section 50. An insulating layer 9 is formed between the first electroconductive layer 71 and the second electroconductive layer 72.

Intrinsic silicon-based thin-films 2a and 2b are preferably provided between the single-crystal silicon substrate 1 of the first conductivity type and the conductive silicon-based thin-films 3a and 3b. A back side metal electrode 8 is preferably provided on the back side transparent electrode layer 6b.

First, the single-crystal silicon substrate 1 of the first conductivity type used in the crystalline silicon-based solar cell will be described. Generally, the single-crystal silicon substrate contains impurities that supply charges to silicon for imparting conductivity. The single-crystal silicon substrate is classified into an n-type which contains atoms for introducing electrons into silicon atoms (e.g. phosphorus) and a p-type which contains atoms for introducing holes into silicon atoms (e.g. boron). That is, the "first conductivity type" in the present invention means one of the n-type and the p-type.

In a heterojunction solar cell, electron/hole pairs can be efficiently separated and collected by setting a reverse junction as a heterojunction on the incident side at which light incident to the single-crystal silicon substrate is absorbed most, thereby providing a strong electric field. Therefore, the heterojunction on the light incident side is preferably a reverse junction. When holes and electrons are compared, electrons, which are smaller in effective mass and scattering cross section, are generally larger in mobility. Accordingly, it is preferred that the crystalline silicon substrate 1 is an n-type single-crystal silicon substrate. In order to enhance a light confinement, the single-crystal silicon substrate preferably has textured structure in its surface.

A silicon-based thin-film is formed on the surface of the single-crystal silicon substrate 1 of the first conductivity type on which a texture is formed. The method for forming these silicon-based thin-film layers is preferably plasma enhanced CVD. Conditions used for forming the silicon-based thin-film layers are preferably as follows: a substrate temperature of 100 to 300° C., a pressure of 20 to 2600 Pa, and a high-frequency power density of 0.004 to 0.8 W/cm$^2$. A source gas used to form the silicon-based thin-film layers may be a silicon-containing gas such as $SiH_4$ or $Si_2H_6$, or a mixed gas of silicon-based gas and $H_2$.

The conductive silicon-based thin-films 3a and 3b are silicon-based thin-film of the first conductivity type or an opposite conductivity type. For example, when an n-type single-crystal silicon substrate is used as the single-crystal silicon substrate 1 of the first conductivity type, the silicon-based thin-film of the first conductivity type and the silicon-based thin-film of the opposite conductivity type are n- and p-types, respectively. A dopant gas for forming the p-type layer or the n-type layer is preferably, for example, $B_2H_6$ or $PH_3$. The amount of impurity such as P or B added is sufficient to be a trace amount; thus, it is preferred to use a mixed gas wherein $B_2H_6$ or $PH_3$ is beforehand diluted with $SiH_4$ or $H_2$. When a gas containing a different element, such as $CH_4$, $CO_2$, $NH_3$ or $GeH_4$, is added thereto, silicon is alloyed so that the energy gaps of the conductive silicon-based thin-film layers can be changed.

Examples of the silicon-based thin-film include an amorphous silicon thin-film and microcrystalline silicon thin-film (a thin-film including amorphous silicon and crystalline silicon). Among them, an amorphous silicon-based thin-film is preferably used. When an n-type single-crystal silicon substrate is used as the single-crystal silicon substrate 1 of the first conductivity type, examples of the preferred structure of the photoelectric conversion section 50 include a stacked structure in the order of: transparent electrode layer 6a/p-type amorphous silicon-based thin-film 3a/i-type amorphous silicon-based thin-film 2a/n-type single-crystal silicon substrate 1/i-type amorphous silicon-based thin-film 2b/n-type amorphous silicon-based thin-film 3b/transparent electrode layer 6b. In this case, for the aforementioned reason, the light incident surface is preferably on the p layer side.

The intrinsic silicon-based thin-films 2a and 2b are preferably i-type hydrogenated amorphous silicon composed of silicon and hydrogen. When i-type hydrogenated amorphous silicon is formed on a single-crystal silicon substrate by a CVD method, surface passivation can be effectively performed while suppressing diffusion of impurities to the single-crystal silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer or a p-type amorphous silicon oxide layer. The p-type hydrogenated amorphous silicon layer is preferable for suppressing impurity diffusion and reducing series resistance. On the other hand, the p-type amorphous silicon carbide layer and the p-type amorphous silicon oxide layer are wide-gap low-refractive index layers, and therefore preferable in the sense that the optical loss can be reduced.

The photoelectric conversion section 50 of the heterojunction solar cell 101 preferably includes transparent electrode layers 6a and 6b on the conductive silicon-based thin-films 3a and 3b. The transparent electrode layer is formed by a transparent electrode layer forming step. The transparent electrode layers 6a and 6b have a conductive oxide as a main component. As the conductive oxide, for example, zinc oxide, indium oxide and tin oxide may be used alone or in mixture thereof. From the viewpoints of electroconductivity, optical characteristics and long-term reliability, indium-based oxides including indium oxide are preferable. Among them, those having indium tin oxide (ITO) as a main component are more suitably used. Here, the wording "as a main component" means that the content is more than 50% by weight, preferably 70% by weight or more, more preferably 90% by weight or more. The transparent electrode layer may be a single layer or a layered structure composed of multiple layers.

A dopant can be added to the transparent electrode layer. For example, when zinc oxide is used for the transparent electrode layer, examples of the dopant include aluminum, gallium, boron, silicon and carbon. When indium oxide is used for the transparent electrode layer, examples of the dopant include zinc, tin, titanium, tungsten, molybdenum and silicon. When tin oxide is used for the transparent electrode layer, examples of the dopant include fluorine.

The dopant can be added to one or both of the light incident side transparent electrode layer 6a and the back side transparent electrode layer 6b. In particular, the dopant is preferably added to the light incident side transparent electrode layer 6a. By adding the dopant to the light incident side transparent electrode layer 6a, the transparent electrode layer itself is made less resistive, and the resistance loss between the transparent electrode layer 6a and the collecting electrode 70 can be suppressed.

The thickness of the light incident side transparent electrode layer 6a is preferably set to 10 nm or more and 140 nm or less, from the viewpoints of transparency, electroconductivity and reduction of light reflection. The role of the transparent electrode layer 6a is to transport carriers to the collecting electrode 70, and it suffices that the transparent electrode layer 6a has a level of electroconductivity required for this purpose, and the thickness of the transparent electrode layer 6a is preferably 10 nm or more. By ensuring that the thickness is 140 nm or less, the absorption loss at the transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited, but a physical vapor deposition method such as a sputtering method, a chemical vapor deposition (MOCVD) method utilizing a reaction of an organic metal compound with oxygen or water, or the like is preferable. In any formation methods, energy from heat or plasma discharge may be utilized.

The substrate temperature during the formation of the transparent electrode layer may appropriately set. For example, when an amorphous silicon-based thin-film is used as a silicon-based thin-film, the substrate temperature is preferably 200° C. or lower. By ensuring that the substrate temperature is 200° C. or lower, desorption of hydrogen from the amorphous silicon layer and associated generation of a dangling bond to a silicon atom can be suppressed, and as a result, conversion efficiency can be improved.

A back side metal electrode 8 is preferably formed on the back side transparent electrode layer 6b. For the back side metal electrode 8, it is desirable to use a material having a high reflectivity in a near-infrared to infrared range, and having high electroconductivity and chemical stability. Examples of the material satisfying these characteristics include silver and aluminum. The method for forming a back side metal electrode layer is not particularly limited, and a physical vapor deposition method such as a sputtering method or a vacuum vapor deposition method, a printing method such as screen printing, or the like is applicable.

The collecting electrode 70 is formed on the transparent electrode layer 6a. The collecting electrode 70 includes a first electroconductive layer 71 and a second electroconductive layer 72. The first electroconductive layer 71 includes a low-melting-point material. The low-melting-point material preferably has a thermal-fluidization onset temperature $T_1$ that is lower than the heat-resistant temperature of the photoelectric conversion section.

The insulating layer 9 is formed between the first electroconductive layer 71 and the second electroconductive layer 72. In the collecting electrode 70 of the present invention, a part of the second electroconductive layer 72 is conductively connected with the first electroconductive layer 71. Here, the wording "a part of . . . is conductively connected with . . . " typically refers to a state in which a conductive connection is established by forming an opening section in the insulating layer and filling the opening section with a material of the second electroconductive layer. In addition, a state is also included in which the thickness of a part of the insulating layer 9 is very small, i.e. only several nanometers, and resultantly the second electroconductive layer 72 is conductively connected with the first electroconductive layer 71. For example, when the low-melting-point material of the first electroconductive layer 71 is a metallic material such as aluminum, mention is made of a state in which a conductive connection is established between the first electroconductive layer 71 and the second electroconductive layer via an oxide covering (corresponding to the insulating layer) formed on the surface of the first electroconductive layer.

In the present invention, the second electroconductive layer 72 is preferably conductively connected with the first electroconductive layer 71 via the opening section 9h of the insulating layer 9. The method for forming an opening section is not particularly limited, but in the present invention, a method is suitably employed in which after forming the insulating layer 9 on the first electroconductive layer 71, the layer is heated (annealed) to a temperature equal to or higher than the thermal-fluidization onset temperature $T_1$ of the low-melting-point material. As a result of heating the first electroconductive layer, the low-melting-point material is fluidized to cause a change in surface shape of the first electroconductive layer, and accordingly an opening (cracks) can be generated in the insulating layer 9 formed on the first electroconductive layer 71.

Figure 3:
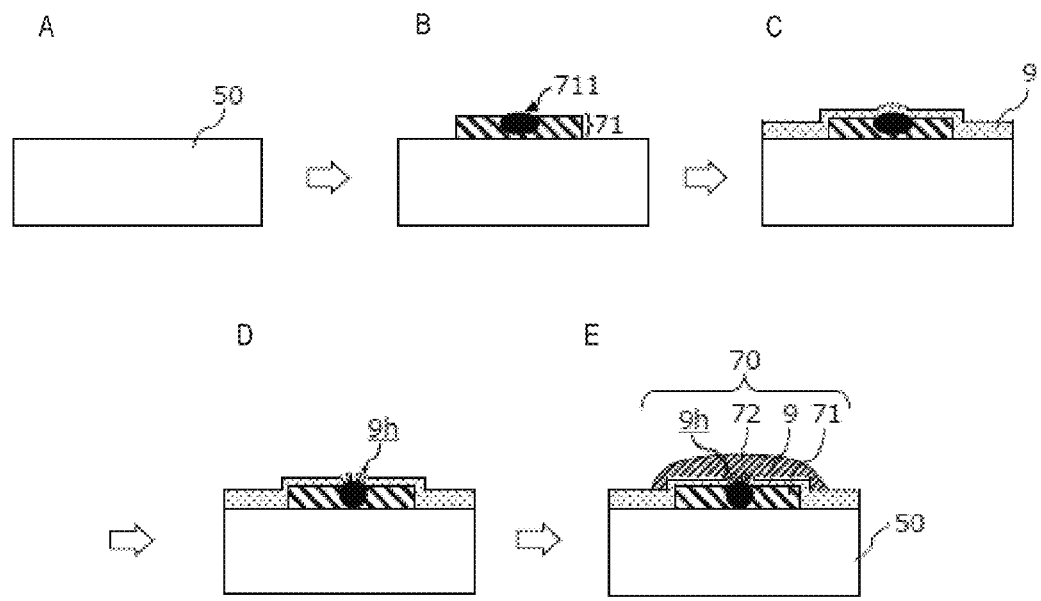
FIG. 3 is a conceptual view of a process of manufacture of a solar cell according to one embodiment of the present invention.

A preferred aspect of a method of manufacture of a collecting electrode in the present invention will be described below based on the drawings. FIG. 3 is a schematic procedural view of a showing one embodiment of a method for forming a collecting electrode 70 on a photoelectric conversion section 50 of a solar cell. In this embodiment, first, the photoelectric conversion section 50 is provided (a photoelectric conversion section providing step, A). For example, in the case of a heterojunction solar cell, a photoelectric conversion section including a silicon-based thin-film and a transparent electrode layer is provided on a silicon substrate of a first conductivity type, as described above.

A first electroconductive layer 71 containing a low-melting-point material 711 is formed on one main surface of the photoelectric conversion section (a first electroconductive layer forming step, B). An insulating layer 9 is formed on the first electroconductive layer 71 (an insulating layer forming step, C). The insulating layer 9 may be formed only on the first electroconductive layer 71, or may be formed also on a region on which no first electroconductive layer 71 is formed (first electroconductive layer-non-formed region) in the photoelectric conversion section 50. In particular, when a transparent electrode layer is formed on the surface of the photoelectric conversion section 50 as in the heterojunction solar cell, the insulating layer 9 is preferably formed also on the first electroconductive layer-non-formed region.

After the insulating layer 9 is formed, annealing is carried out by heating (an annealing step, D). The first electroconductive layer 71 is heated to an annealing temperature Ta in the annealing step, so that the low-melting-point material is thermally fluidized to thereby change the surface shape, and accordingly the insulating layer 9 formed on the first electroconductive layer 71 is deformed. Typically, deformation of the insulating layer 9 is a formation of an opening section 9h in the insulating layer. The opening section 9h is formed in the form of, for example, cracks.

After carrying out the annealing, a second electroconductive layer 72 is formed by a plating method (a plating step, E). The first electroconductive layer 71 is covered with the insulating layer 9, but in a section, where the opening section 9h is formed in the insulating layer 9, the first electroconductive layer 71 is exposed. Therefore, the first electroconductive layer is exposed to plating solution, so that metal can be deposited at the opening section 9h forming an origination point. According to this method, a second electroconductive layer matching the shape of the collecting electrode can be formed by a plating method without providing a resist material layer having an opening section matching the shape of the collecting electrode.

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electrolytic plating. In this specification, those having a volume resistivity of $10^{-2}$ Ω·cm or less are defined as being electroconductive. Those having a volume resistivity of $10^2$ Ω·cm or more are defined as insulating.

The thickness of the first electroconductive layer 71 is preferably 20 µm or less, more preferably 10 µm or less, in terms of costs. On the other hand, the thickness is preferably 0.5 µm or more, more preferably 1 µm or more, so that the line resistance of the first electroconductive layer 71 falls within a desired range.

The first electroconductive layer 71 contains a low-melting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

The low-melting-point material is preferably thermally fluidized in the annealing step, thus causing a change in surface shape of the first electroconductive layer 71. Therefore, the thermal-fluidization onset temperature $T_1$ of the low-melting-point material is preferably lower than an annealing temperature Ta. In the present invention, the annealing step is preferably carried out at the annealing temperature Ta that is lower than the heat-resistant temperature of the photoelectric conversion section 50. Therefore, the thermal-fluidization onset temperature $T_1$ of the low-melting-point material is preferably lower than the heat-resistant temperature of the photoelectric conversion section.

The heat-resistant temperature of the photoelectric conversion section is a temperature at which characteristics of a solar cell module prepared using a solar cell (also referred to as a "solar cell" or a "cell") or a solar cell including the photoelectric conversion section are irreversibly reduced. For example, in the heterojunction solar cell 101 shown in FIG. 2, the single-crystal silicon substrate 1 that forms the photoelectric conversion section 50 hardly undergoes a change in characteristics even when heated to a high temperature of 500° C. or higher, but the transparent electrode layers 6a, 6b and amorphous silicon-based thin-films 2a, 2b, and 3a, and 3b may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally fluidized in the step of forming the first electroconductive layer, so that an amount of surface shape change of the first electroconductive layer in the annealing step is increased to form the opening section 9h in the insulating layer 9 easily. For example, when the first electroconductive layer is formed by coating or printing, heating may be carried out for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating. If the low-melting-point material is a metallic material, the contact resistance between the photoelectric conversion section 50 and the collecting electrode 70 can also be reduced.

As the low-melting-point material, a low-melting metallic material alone or an alloy thereof, or a mixture of a plurality of low-melting metallic materials can be suitably used. Examples of the low-melting metallic material include indium, bismuth and gallium.

Figure 4:
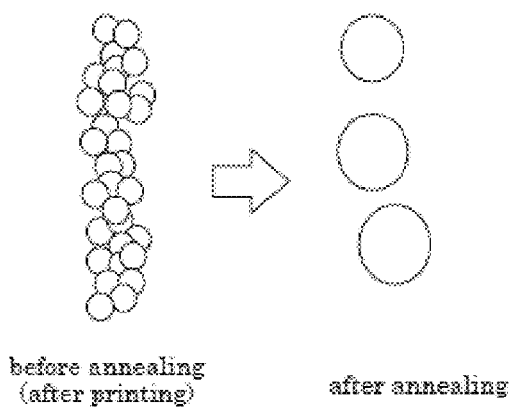
FIG. 4 is a conceptual view showing one example of a shape change of a low-melting-point material during heating.

The first electroconductive layer 71 preferably contains, in addition to the aforementioned low-melting-point material, high-melting-point material having thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that conversion efficiency of the solar cell can be improved. For example, when a material with high surface energy is used as the low-melting-point material, the first electroconductive layer 71 is exposed to a high temperature in the annealing step, the low-melting-point material is thereby brought into liquid phase state and as a result, as shown conceptually in FIG. 4, particles of the low-melting-point material aggregate into coarse particles, so that disconnecting occurs in the first electroconductive layer 71 in some cases. In contrast, the high-melting-point material is not brought into a liquid phase state by heating in the annealing step, and therefore by including the high-melting-point material in the first electroconductive layer forming material, disconnecting of the first electroconductive layer by coarsening of the low-melting-point material as shown in FIG. 4 can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material and the annealing temperature Ta in the annealing step preferably satisfy $T_1 < Ta < T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-meltingpoint material, for example, a metallic material alone such as silver, aluminum or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming an opening section in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material:high-melting-point material) is set to in a range of 5:95 to 67:33. The weight ratio between the low-melting-point material the high-melting-point material is more preferably set to from 10:90 to 50:50, further preferably set to from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of an opening in the insulating layer in the annealing step is facilitated. The particle size $D_L$ of the low-melting-point material is preferably 0.25 μm or more, more preferably 0.5 μm or more. When the first electroconductive layer 71 is formed by a printing method such as screen printing, the particle size of particles can be appropriately set according to, for example, the mesh size of a screen plate. For example, the particle size is preferably smaller than the mesh size, more preferably no more than ½ of the mesh size. When particles are non-spherical, the particle size is defined by the diameter of a circle having an area equal to the projected area of particles (projected area-circle equivalent diameter, Heywood diameter).

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing step is non-spherical, the amount of change in surface shape of the first electroconductive layer is larger because particles become more spherical when heated to the thermal-fluidization onset temperature $T_1$ or higher in the annealing step. Therefore, it becomes easy to form an opening section in the insulating layer 9 on the first electroconductive layer 71.

As described above, the first electroconductive layer 71 shows electroconductivity, and it suffices that its volume resistivity is $10^{-2}$ Ω·cm or less. The volume resistivity of the first electroconductive layer 71 is preferably $10^{-4}$ Ω·cm or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the high-melting-point material has electroconductivity. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

Besides using the combination of the low-melting-point material and the high-melting-point material described above as the material of the first electrically conductive layer 71, conversion efficiency may also be improved by adjusting the size of materials (e.g. particle size) and the like to suppress the disconnecting of the first electroconductive layer due to heating in the annealing step. For example, even a material having a high melting point, e.g. silver, copper or gold, in the form of fine particles having a particle size of 1 μm or less, undergoes sintering-necking (fusion of fine particles) at a temperature lower than the melting point, i.e. about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first electroconductive layer can be changed to form an opening section in the insulating layer 9. Even when fine particles are heated to the sintering-necking onset temperature or higher, the fine particles retains a solid phase state at any temperature that is lower than a melting point $T_2'$, and therefore disconnecting by coarsening of the material as shown in FIG. 4 hardly occurs. In this respect, it can be said that the material that undergoes sintering-necking, such as metal fine particles, has an aspect of the "high-melting-point material" as well while being the "low-melting-point material" in the present invention.

Figure 5A:
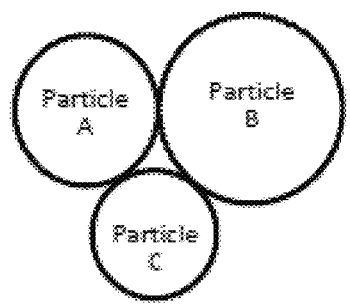
FIGS. 5A-5C are conceptual views for explaining a shape change and necking of a low-melting-point material powder during heating.
Figure 5B:
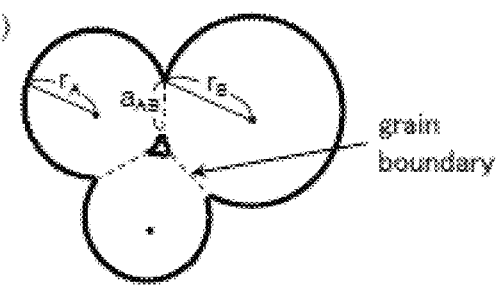
Figure 5C:
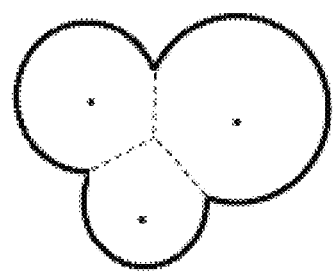

In the material that undergoes sintering-necking, the sintering-necking onset temperature $T_1'$ can be defined as being equal to a thermal-fluidization onset temperature $T_1$. FIGS. 5A-5C are views for explaining the sintering-necking onset temperature. FIG. 5A is a plan view schematically showing particles before sintering. Particles contact one another at points because they are particles before sintering. FIGS. 5B and 5C are sectional views each schematically showing a state when particles after the onset of sintering are cut along a cross section that passes through the center of each particle. FIG. 5B shows particles after the onset of sintering (initial sintering stage), and FIG. 5C shows a state in which the particles of FIG. 5B are further sintered. In FIG. 5B, the grain boundary between a particle A (radius: $r_A$) and a particle B (radius: $r_B$) is shown by a dotted line segment (length: $a_{AB}$).

Figure 6A:
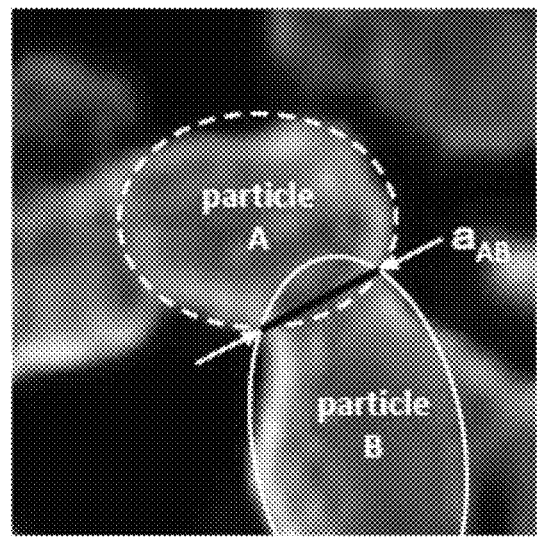
FIGS. 6A-6B are SEM photographs of metal fine particles in which sintering-necking occurs.
Figure 6B:
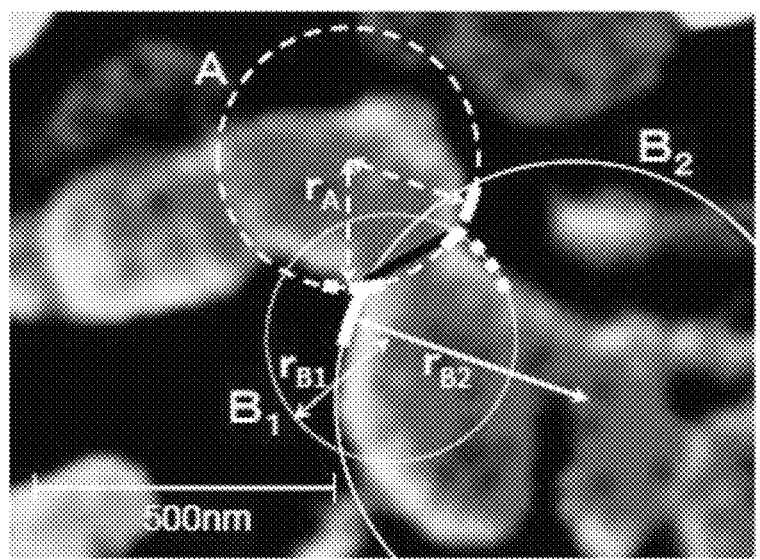

The sintering-necking onset temperature $T_1'$ is defined by a temperature at which the ratio of the length $a_{AB}$ of the grain boundary to max $(r_A, r_B)$, that is the larger of $r_A$ and $r_B$, $a_{AB}/\max(r_A, r_B)$, is 0.1 or more. That is, the temperature, at which $a_{AB}/\max(r_A, r_B)$ of at least a pair of particles is 0.1 or more, is referred to as a sintering-necking onset temperature. In FIGS. 5A-5C, particles are shown as being spherical for simplification, but when particles are not spherical, the curvature radius of a particle near the grain boundary is considered as the radius of the particle. When the curvature radius of the particle near the grain boundary varies depending on the location, the largest curvature radius among measurement points is considered as the radius of the particle. For example, as shown in FIG. 6A, a grain boundary having a length of $a_{AB}$ is formed between a pair of fine particles A and B that undergo sintering. In this case, the shape of the particle A near the grain boundary is approximated by the arc of an imaginary circle A shown in a dashed line. On the other hand, for the shape of the particle B near the grain boundary, one is approximated by the arc of an imaginary circle $B_1$ shown in a dotted line, and the other is approximated by the arc of an imaginary circle $B_2$ shown in a solid line. As shown in FIG. 6B, $r_{B2}$ is larger than $r_{B1}$, and therefore $r_{B2}$ is considered as the radius $r_B$ of the particle B. The aforementioned imaginary circle can be determined by a method in which a boundary is defined by monochromatic binarization processing of an observed image at the cross section or the surface, and central coordinates and a radius are calculated by a least square method based on the coordinates of the boundary near the grain boundary. When it is difficult to accurately measure the sintering-necking onset temperature based on the aforementioned definition, a first electroconductive layer containing fine particles is formed, an insulating layer is formed thereon, and a temperature, at which an opening section (cracks) is generated in the insulating layer by heating, can be considered as a sintering-necking onset temperature.

For the material forming the first electroconductive layer, a paste or the like containing a binder resin or the like can be suitably used, besides the aforementioned low-melting-point material (and the high-melting-point material). For sufficiently improving the electroconductivity of the first electroconductive layer formed by a screen printing method, it is desirable to cure the first electroconductive layer by a heat treatment. Therefore, for the binder resin contained in the paste, a material that can be cured at the aforementioned drying temperature is preferably used, and an epoxy-based resin, a phenol-based resin, an acrylic resin and the like are applicable. This is because in this case, the shape of the low-melting-point material is changed as it is cured, and as shown in D of FIG. 3, an opening (cracks) is easily generated in the insulating layer near the low-melting-point material in the annealing treatment. It suffices that the ratio between the binder resin and the electroconductive low-melting-point material is set so as to be equal to or more than the so-called percolation threshold (a critical value of a ratio corresponding to the low-melting-point material content at which electroconductivity is exhibited).

The first electroconductive layer 71 can be prepared by a known technique such as an inkjet method, a screen printing method, a conductor wire bonding method, a spray method, a vacuum deposition method, or a sputtering method. The first electroconductive layer 71 is preferably patterned in a specific shape such as a comb-like pattern. For formation of the patterned first electroconductive layer, the screen printing method is suitable to increase productivity. For the screen printing method, a method is suitably used in which a collecting electrode pattern is printed using a printing paste containing a low-melting-point material made of metal particles and a screen plate having an opening pattern matching the pattern shape of the collecting electrode.

On the other hand, when a material containing a solvent is used as a printing paste, a drying step for removing the solvent is required. As described previously, the drying temperature in this case is preferably lower than the thermal-fluidization onset temperature $T_1$ of the low-melting-point material. The drying time can be appropriately set at, for example, about 5 minutes to 1 hour.

The first electroconductive layer may be composed of a plurality of layers. The first electroconductive layer may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material.

Explanations have been provided above principally for the case of forming the first electroconductive layer by a printing method, but the method for forming the first electroconductive layer is not limited to the printing method. For example, the first electroconductive layer may be formed by a deposition method or a sputtering method using a mask matching the pattern shape.

(Insulating Layer)

The insulating layer 9 is formed on the first electroconductive layer 71. Here, when the first electroconductive layer 71 is formed in a specific pattern (e.g. a comb-like pattern), the surface of the photoelectric conversion section 50 has a first electroconductive layer-formed region where the first electroconductive layer is formed, and a first electroconductive layer-non-formed region where no first electroconductive layer is formed. The insulating layer 9 is formed at least on the first electroconductive layer-formed region. In the present invention, the insulating layer 9 is preferably formed on the first electroconductive layer-non-formed region as well, and is especially preferably formed on the entire surface of the first electroconductive layer-non-formed region. When the insulating layer is also formed on the first electroconductive layer-non-formed region as well, the photoelectric conversion section can be chemically and electrically protected from a plating solution when the second electroconductive layer is formed by a plating method. For example, when a transparent electrode layer is formed on the surface of the photoelectric conversion section 50 as in a heterojunction solar cell, by formation of the insulating layer on the surface of the transparent electrode layer, contact of the transparent electrode layer with a plating solution is suppressed, so that deposition of a metallic layer (second electroconductive layer) onto the transparent electrode layer can be prevented. The insulating layer is more preferably formed on the entire first electroconductive layer-formed region and first electroconductive layer-non-formed region to increase productivity.

As the material of the insulating layer 9, a material that is electrically insulating is used. It is desirable that the insulating layer 9 be a material having chemical stability to a plating solution. By using a material having high chemical stability to a plating solution, the insulating layer is hardly dissolved in a plating step during formation of the second electroconductive layer, so that damage to the surface of the photoelectric conversion section is hindered. When the insulating layer 9 is formed on the first electroconductive layer-non-formed region as well, the insulating layer preferably has high adhesive strength with the photoelectric conversion section 50. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light incident surface side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second electroconductive layer. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

The material of the insulating layer may be an inorganic insulating material or an organic insulating material. As the inorganic insulating material, a material such as silicon oxide, silicon nitride, titanium oxide, aluminum oxide, magnesium oxide or zinc oxide can be used. As the organic insulating material, a material such as polyester, an ethylene-vinyl acetate copolymer, acrylic, epoxy or polyurethane can be used. The material of the insulating layer is preferably an inorganic material having a low elongation at break, so that a formation of an opening in the insulating layer, which occurs as the surface shape of the first electroconductive layer changes by stress or the like at the interface, in the annealing step is facilitated Among these inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate or the like is suitably used from the viewpoints of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride or the like is preferable from the viewpoints of electrical characteristics, adhesiveness with the transparent electrode layer, and so on, and silicon oxide, silicon nitride or the like is especially suitably used to adjust the refractive index appropriately. These inorganic materials are not limited to those having a stoichiometric composition, but may be those having oxygen-deficiencies.

The thickness of the insulating layer 9 may be set appropriately, according to the material of the insulating layer and method of formation thereof. The thickness of the insulating layer 9 is preferably so thin that an opening section can be formed in the insulating layer by stress or the like at the interface, which occurs as the surface shape of the first electroconductive layer is changed in the annealing step. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the solar cell is increased, so that conversion efficiency can be further improved. For obtaining this effect, the refractive index of the insulating layer 9 is preferably lower than the refractive index of the surface of the photoelectric conversion section 50. In order to impart suitable antireflection characteristics to the insulating layer 9, the thickness is preferably set within a range of 30 nm to 250 nm, and more preferably set within a range of 50 nm to 250 nm. The thickness of the insulating layer on the first electroconductive layer-formed region and the thickness of the insulating layer on the first electroconductive layer-non-formed region may be mutually different. For example, the thickness of the insulating layer may be set so as to facilitate a formation of an opening section in the annealing step as to the first electroconductive layer-formed region, and the thickness of the insulating layer may be set so as to have an optical thickness with appropriate antireflection characteristics as to the first electroconductive layer-non-formed region.

When a transparent electrode layer (the refractive index of which is generally about 1.9 to 2.1) is provided on the photoelectric conversion section 50 as in the heterojunction solar cell, the refractive index of the insulating layer is preferably an intermediate value between the refractive index of air (1.0) and the refractive index of the transparent electrode layer to enhance an anti-reflection effect at the interfaces thereby increasing an amount of light introduced into the solar cell. When the solar cells are sealed to be modularized, the refractive index of the insulating layer is preferably an intermediate value between the refractive index of a sealing material and the refractive index of the transparent electrode layer. Accordingly, the refractive index of the insulating layer 9 is, for example, preferably 1.4 to 1.9, more preferably 1.5 to 1.8, further preferably 1.55 to 1.75. The refractive index of the insulating layer can be adjusted to fall within a desired range according to the material, composition and the like of the insulating layer. For example, in the case of silicon oxide, the refractive index is increased by decreasing the oxygen content. Unless otherwise specified, the refractive index in this specification is a refractive index to light having a wavelength of 550 nm and a value measured by spectroscopic ellipsometry. The optical thickness (refractive index×thickness) of the insulating layer is preferably set according to the refractive index of the insulating layer so that anti-reflection characteristics are improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

Above all, the insulating layer 9 is preferably formed by the plasma-enhanced CVD method so as to form a film having a more densified structure. By this method, a film having a structure with high density can be formed even when an insulating layer having a small thickness of ca. 30 to 100 nm, as well as a large thickness of about 200 nm, is formed.

For example, when the photoelectric conversion section 50 has on its surface a textured structure (uneven structure) as in the crystalline silicon-based solar cell shown in FIG. 2, the insulating layer is preferably formed by the plasma-enhanced CVD method so that a densified film may be formed even at recessed and raised portions of the texture. By using an insulating layer having high density, damage to the transparent electrode layer during a plating treatment can be reduced, and also deposition of a metal onto the transparent electrode layer can be prevented. Thus, the insulating layer having high density can function as a barrier layer to water, oxygen and the like for a layer within the photoelectric conversion section 50, like the silicon-based thin-film 3*a* in the crystalline silicon-based solar cell in FIG. 2, so that an effect of improving long-term reliability of the solar cell can also be expected.

The shape of the insulating layer 9 present between the first electroconductive layer 71 and the second electroconductive layer 72, i.e. the insulating layer 9 on the first electroconductive layer-formed region does not have to be necessarily a seamless layer, but may be an island layer. The term "island" in this specification means a state in which a non-formed region, on which no insulating layer 9 is formed, is provided at a part of the surface.

In the present invention, the insulating layer 9 can also contribute to improvement of adhesive strength between the first electroconductive layer 71 and the second electroconductive layer 72. For example, when a Cu layer is formed on an Ag layer as an under-layer electrode by a plating method, adhesive strength between the Ag layer and the Cu layer is low, but it can be expected that the adhesive strength of the second electroconductive layer is increased to improve the reliability of the solar cell as a result of formation of the Cu layer on an insulating layer of silicon oxide or the like.

In the present invention, the annealing step is carried out after the insulating layer 9 is formed on the first electroconductive layer 71 and before the second electroconductive layer 72 is formed. In the annealing step, the first electroconductive layer 71 is heated to a temperature higher than the thermal-fluidization onset temperature $T_1$ of the low-melting-point material, and the low-melting-point material is fluidized, so that the surface shape of the first electroconductive layer is changed. In association with this change, the opening section 9h is formed in the insulating layer 9 on the first electroconductive layer. Therefore, in the subsequent plating step, a part of the surface of the first electroconductive layer 71 is exposed to a plating solution for conducting electricity, thus making it possible to deposit a metal on the conducting part as origination point as shown in E of FIG. 3.

The opening section is formed principally on the low-melting-point material 711 of the first electroconductive layer 71. When the low-melting-point material is an insulating material, a part immediately below the opening section is insulating, but a plating solution is also penetrated into the electroconductive high-melting-point material present on the periphery of the low-melting-point material, and therefore a conductive connection can be established between the first electroconductive layer and the plating solution.

The annealing temperature (heating temperature) Ta in the annealing step is preferably higher than the thermal-fluidization onset temperature $T_1$ of the low-melting-point material, i.e. $T_1$<Ta. The annealing temperature Ta more preferably satisfies $T_1+1°$ C.≤Ta≤$T_1+100°$ C., and further preferably satisfies $T_1+5°$ C.≤Ta≤$T_1+60°$ C. The annealing temperature can be appropriately set according to the composition and content of the material of the first electroconductive layer, and so on.

The annealing temperature Ta is preferably lower than the heat-resistant temperature of the photoelectric conversion section 50 as described above. The heat-resistant temperature of the photoelectric conversion section varies depending on the configuration of the photoelectric conversion section. For example, when a transparent electrode layer and an amorphous silicon-based thin-film are provided as in the heterojunction solar cell or the silicon-based thin-film solar cell, the heat-resistant temperature is about 250° C. Thus, in the case of the heterojunction solar cell or the silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower. In association therewith, the thermal-fluidization onset temperature $T_1$ of the low-melting-point material of the first electroconductive layer 71 is preferably lower than 250° C., more preferably lower than 200° C., further preferably lower than 180° C.

On the other hand, a crystalline silicon solar cell having a diffusion layer of an opposite conductivity type on one main surface of a crystalline silicon substrate of a first conductivity type has neither an amorphous silicon thin-film nor a transparent electrode layer, and therefore shows a heat-resistant temperature of about 800° C. to 900° C. Thus, the annealing step may be carried out at an annealing temperature Ta higher than 250° C.

After carrying out the annealing step, the second electroconductive layer 72 is formed on the insulating layer 9 of the first electroconductive layer-formed region by a plating method. At this time, the metal deposited as the second electroconductive layer is not particularly limited as long as it is a material that can be formed by a plating method, and for example, copper, nickel, tin, aluminum, chromium, silver, gold, zinc, lead, palladium or the like, or a mixture thereof can be used.

Electric current principally passes through the second electroconductive layer during operation (electricity generation) of the solar cell. Thus, the line resistance of the second electroconductive layer is preferably as low as possible so as to suppress the resistance loss in the second electroconductive layer. Specifically, the line resistance of the second electroconductive layer is preferably 1 Ω/cm or less, more preferably 0.5 Ω/cm or less. On the other hand, it suffices that the line resistance of the first electroconductive layer is so low that the layer can function as an underlying layer at the time of electroplating, with an example thereof being 5 Ω/cm or less.

The second electroconductive layer can be formed by either of an electroless plating method and an electrolytic plating method, but the electrolytic plating method is suitably used in order to increase productivity. In the electrolytic plating method, the rate of deposition of a metal can be increased, so that the second electroconductive layer can be formed in a short time.

Figure 7:
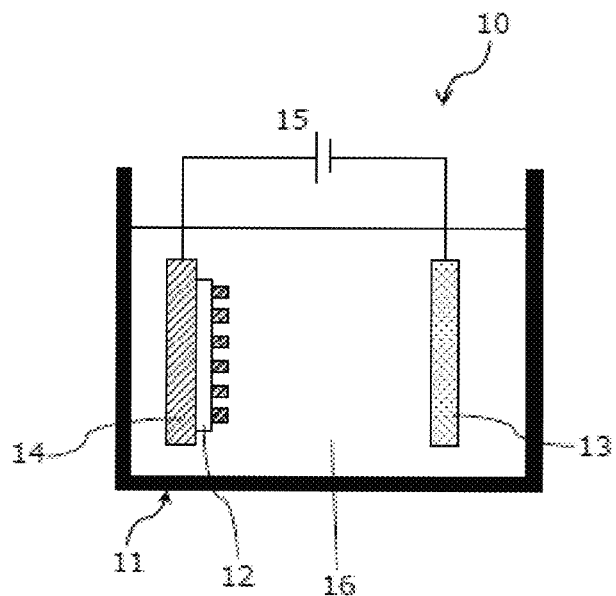
FIG. 7 is a structural schematic view of a plating apparatus.
Figure 7:
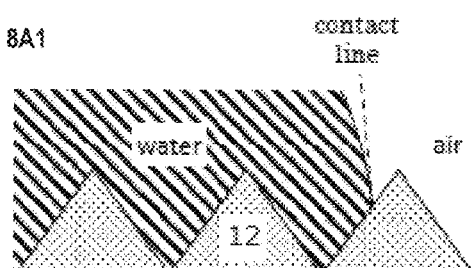
Figure 7:
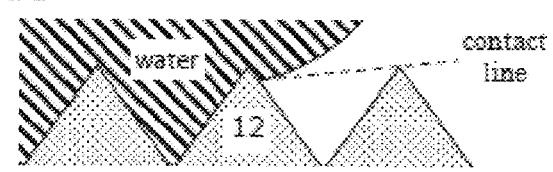

A method for forming a second electroconductive layer by the electrolytic plating method will be described taking acidic copper plating as an example. FIG. 7 is a conceptual view of a plating apparatus 10 that is used for forming the second electroconductive layer. A substrate 12, which has a first electroconductive layer and an insulating layer formed on a photoelectric conversion section, and is subjected to an annealing treatment, and an anode 13 are immersed in a plating solution 16 in a plating tank 11. The first electroconductive layer 71 on the substrate 12 is connected to a power source 15 through a substrate holder 14. By applying a voltage between the anode 13 and the substrate 12, copper can be selectively deposited at a part on the first electroconductive layer, which is not covered with the insulating layer 9, i.e. an opening section generated in the insulating layer by the annealing treatment, as an origination point.

The plating solution 16 used for acidic copper plating contains copper ions. For example, a solution of known composition, which has copper sulfate, sulfuric acid and water as main components, can be used, and by causing a current of 0.1 to 10 A/dm$^2$ to pass therethrough, a metal as the second electroconductive layer can be deposited. The suitable plating time is appropriately set according to the area of a collecting electrode, the current density, cathode current efficiency, desired thickness and so on.

The second electroconductive layer may be composed of a plurality of layers. For example, by forming a first plating layer, made of a material having a high electroconductivity, such as Cu, on the first electroconductive layer with an insulating layer interposed therebetween, and then forming on the surface of the first plating layer a second plating layer excellent in chemical stability, a collecting electrode having low resistance and being excellent in chemical stability can be formed.

It is preferable that after carrying out the plating step, a plating solution removing step be provided to remove a plating solution remaining on the surface of the substrate 12. By providing the plating solution removing step, a metal that can be deposited at a part, other than at the opening section 9h of the insulating layer 9 formed in the annealing step, as an origination point can be removed. Examples of the metal deposited at a part other than at the opening section 9h as an origination point include those deposited at a pinhole in the insulating layer 9 as an origination point. As a result of removing such a metal by the plating solution removing step, the shading loss is reduced, so that solar cell characteristics can be further improved.

Removal of the plating solution can be performed by, for example, a method in which plating solution remaining on the surface of the substrate 12 taken out from a plating tank is removed by air blow-type air washing, rinsing is then carried out, and a washing fluid is blown off by air blow. By reducing the amount of plating solution remaining on the surface of the substrate 12 by carrying out air washing before rinsing, the amount of the plating solution brought in at the time of rinsing can be decreased. Therefore, the amount of washing fluid required for rinsing can be decreased, and time and effort for waste liquid treatment associated with rinsing can also be reduced, so that environmental burdens and expenses resulting from washing are reduced, and productivity of the solar cell can be improved.

For facilitating removal of the plating solution, the wettability of the surface of the substrate 12 is preferably controlled. The wettability of the surface can be evaluated by a contact angle θ to water. The contact angle θ of the surface of the substrate 12 with water is preferably 20° or more. As a result of controlling the contact angle of the surface of the substrate with water to an appropriate range, the amount of plating solution remaining on the surface of the substrate 12 taken out from a plating tank after the plating step can be reduced, and removal of the plating solution by air blow becomes easy. Since the amount of the plating solution taken from the plating tank reduces, utilization efficiency of the plating solution can be improved.

The "substrate surface" refers to a surface that may contact the plating solution in the plating step. That is, the "substrate surface" means: (1) the surface of the photoelectric conversion section; (2) the surface of the photoelectric conversion section and the surface of the first electroconductive layer; or (3) the surface of the insulating layer. When the insulating layer 9 is formed on the surfaces of both the first electroconductive layer-formed region and first electroconductive layer-non-formed region, the "substrate surface" refers to the surface of the insulating layer. In a configuration in which a transparent electrode layer is provided on the surface of the photoelectric conversion section 50, it is preferable that at least the exposed section of the transparent electrode layer be subjected to a water-repellent treatment.

In general, a transparent electrode layer of ITO or the like and an insulating layer of silicon oxide or the like are hydrophilic. Generally, a silicon substrate is hydrophilic because an oxide covering is formed on its surface. Therefore, the contact angle of the surface of the substrate 12, i.e. the surface of the photoelectric conversion section 50 or the surface of the insulating layer 9, with water is often about 10° or less. In the present invention, it is preferable that the surface of the substrate 12 be subjected to a water-repellent treatment for ensuring that the contact angle of the surface of the substrate 12 falls within the aforementioned range. The water-repellent treatment is, for example, formation of a water-repellent layer on the surface. As a result of providing the water-repellent layer on the surface, the contact angle to water can be increased by reducing the wettability of the substrate surface to a plating solution. The water-repellent treatment in this specification means a treatment for reducing the wettability of the surface to water (increasing the contact angle).

Figure 8B:
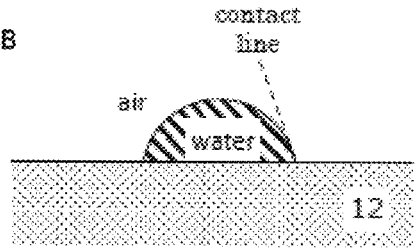

The contact angle is determined by measuring an angle formed by the substrate and a contact line of air and water using a contact angle meter. When a textured surface structure (uneven structure) on an order of several micrometers to several tens of micrometers is provided on the substrate surface as in the crystalline silicon-based solar cell shown in FIG. 2, the angle of the surface of the substrate with the contact line varies from one location to another in a microscopic region in a scale of the surface structure as shown in FIGS. 8A1 and 8A2. Therefore, when a textured structure is provided on the substrate surface, the contact angle is defined by an angle of the substrate with the contact line, which is obtained when observing the surface in such a visual field that the surface can be considered even (e.g. at a scale of about 10 times as large as the size of the surface structure) (see FIG. 8B).

Figure 9:
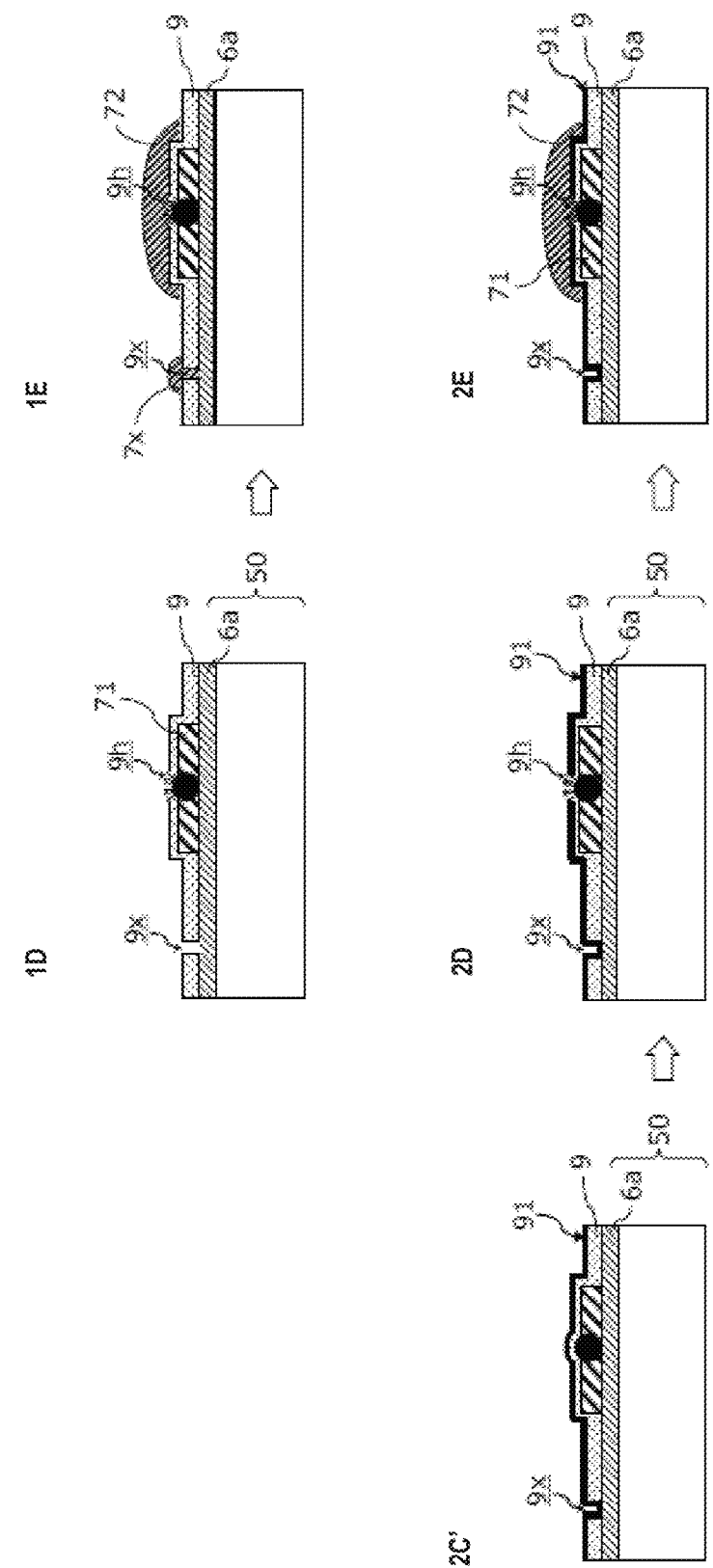
FIG. 9 is a conceptual view of a process of manufacture of a solar cell in one embodiment.

As a result of subjecting the substrate surface to a water-repellent treatment, even when a defect (e.g. a pinhole) occurs in the insulating layer 9, damage to the photoelectric conversion section present under a defect section in the plating step is suppressed, and deposition of a metal onto the defect section can be suppressed. For example, in a configuration in which the transparent electrode layer 6a is provided on the surface of the photoelectric conversion section 50 as in the heterojunction solar cell, the transparent electrode layer 6a and a plating solution can contact (be in conductive contact with) each other via a pinhole 9x when the pinhole 9x is present in the insulating layer 9 as shown in 1D of FIG. 9. Therefore, as shown in 1E of FIG. 9, the second electroconductive layer 72 is deposited at the opening section 9h of the first electroconductive layer-formed region as an origination point, and also a metallic layer 7x may be deposited at the pinhole 9x as an origination point. This metallic layer 7x can cause a shading loss and a current leak. On the other hand, when a water-repellent layer 91 is provided on the surface of the insulating layer 9 in the water-repellent treatment step as shown in 2C' of FIG. 9, damage to the photoelectric conversion section 50 in the plating step is suppressed, and deposition of a metal onto the defect section can be suppressed even if a pinhole 9x is present in the insulating layer (see 2E of FIG. 9). That is, an effect of protecting the surface of the photoelectric conversion section from a plating solution by the water-repellent layer 91 can be expected. In a configuration in which a transparent electrode layer is provided on the surface of the photoelectric conversion section 50 as in the heterojunction solar cell, the surface of the transparent electrode layer 6a is protected from a plating solution by the water-repellent layer. Therefore, it can be expected that defects such as a shading loss and a current leak resulting from deposition of a metal onto the transparent electrode layer of the first electroconductive layer-non-formed region are suppressed, so that the conversion efficiency of the solar cell is improved. That is, as a result of subjecting the substrate surface to a water-repellent treatment, an effect of protecting the surface of the photoelectric conversion section from a plating solution can be expected.

The contact angle θ of the substrate surface with water is preferably greater so that an amount of a plating solution remaining on the surface of the substrate 12 and a metal deposition onto the first electroconductive layer-non-formed region are further reduced On the other hand, according to the result of research by the inventors, the contact angle θ with water is preferably 120° or less, more preferably 110° or less, further preferably 100° or less, so as to improve plating efficiency (weight of metal plated onto substrate/ (current×time)) during formation of the second electroconductive layer. It is thought that when the contact angle θ of the surface of the substrate falls within the aforementioned range, deposition of metal onto the substrate surface is not hindered, and therefore deposition of the metal to an undesired area such as the substrate holder 14 is suppressed to achieve sufficient plating efficiency.

The optimum value of the contact angle θ of the substrate surface for reducing the amount of a remaining plating solution and optimizing plating efficiency also varies depending on the surface shape of the substrate 12. For example, when a surface textured structure on an order of several micrometers to several tens of micrometers that originates in the surface shape of the crystalline silicon substrate 1 is provided as in the heterojunction solar cell shown in FIG. 2, the contact angle θ of the surface of the substrate 12 with water is more preferably in a range of 30° to 120°, further preferably in a range of 40° to 110°, especially preferably in a range of 50° to 100°. On the other hand, when the substrate 12 has no surface texture, the contact angle with water is more preferably 20° to 60°, further preferably 30° to 50°. When a surface textured structure in an order that originates in the surface shape of the insulating substrate and the crystal structure of the thin-film is provided as in the thin-film solar cell, the contact angle θ of the surface of the substrate 12 with water is more preferably in a range of 25° to 70°, further preferably in a range of 35° to 60°.

The water-repellent treatment may be applied to the surface of the photoelectric conversion section 50, or may be applied to the surface of the insulating layer 9. Examples of the specific structure include a layered structure of transparent electrode layer/water-repellent layer/insulating layer in which the water-repellent layer is formed on the transparent electrode layer on the surface of the photoelectric conversion section 50, and the insulating layer is formed on the water-repellent layer, and a layered structure of transparent electrode layer/insulating layer/water-repellent layer in which the water-repellent layer is formed on the insulating layer 9 as shown in 2C', 2D, and 2E of FIG. 9. As described above, the water-repellent treatment is preferably carried out after formation of the insulating layer so as to reduce the wettability of the surface leading to a reduction of an amount of plating solution remaining on the substrate surface after carrying out the plating step.

When the water-repellent treatment is applied onto the insulating layer, the water-repellent treatment is preferably carried out before carrying out the annealing step so as to improve the plating efficiency. The water-repellent treatment is carried out before an origination point for plating (a conductively connected section between the first electroconductive layer and the second electroconductive layer) such as the opening section 9h is formed, so that the wettability of the surface is low (the contact angle is large) in a section where a metallic layer should not be deposited, and the origination point for plating is brought into a state of high wettability (the contact angle is small). Therefore, plating efficiency tends to be improved as compared to the case where the water-repellent treatment is carried out after carrying out the annealing step.

The water-repellent treatment is not necessarily required to be applied to the entire surface of the substrate, but may be applied only to a part of the substrate surface. The water-repellent layer does not have to be necessarily in a seamless layer form, but may be in an island layer form. That is, a water-repellent layer-non-formed region may be present on a part of the substrate 12. When a water-repellent treatment region becomes larger, a water-repellent effect is more easily obtained, and therefore the water-repellent treatment is preferably applied to the entire surface of the substrate. When the water-repellent treatment is carried out after carrying out the annealing step, the water-repellent treatment is preferably not applied onto the opening section as an origination point for plating so as to improve the plating efficiency. Therefore, when the water-repellent treatment is carried out after carrying out the annealing step, the water-repellent treatment is preferably applied to areas other than the opening section. It may be difficult to apply the water-repellent treatment selectively to areas other than the opening section on the first electroconductive layer, and therefore when the water-repellent treatment is carried out after carrying out the annealing step, the water-repellent treatment is preferably applied only to the first electroconductive layer-non-formed region.

When the water-repellent layer 91 is formed as the water-repellent treatment, the thickness thereof is not particularly limited as long as the function of the present invention is not impaired. The water-repellent layer 91 is a layer formed on the light incident side of the photoelectric conversion section 50, and is therefore desired to have small optical absorption and a low reflectivity, so that the amount of light introduced into the photoelectric conversion section is increased. The water-repellent layer can be formed using a known method. Specifically, the water-repellent layer can be formed by applying a silicon-based water-repellent agent, forming on the surface of the insulating layer a molecular film having a hydrophobic group, or the like. Above all, in a self-assembled monolayer having a hydrophobic group, optical absorption in the water-repellent layer can be substantially ignored because it is a monomolecular film. The self-assembled monolayer is suitable as a water-repellent layer material because it has such an advantage that the film is easily formed, and a desired contact angle is easily achieved.

The method of increasing the contact angle of the substrate surface with water by the water-repellent treatment has been described above, but a comparable effect is obtained by forming the insulating layer 9 having water-repellency. That is, by forming the insulating layer 9 having a large contact angle θ (e.g. 20° or more) with water, a special water-repellent treatment step can be omitted, and therefore productivity of the solar cell can be further improved. For example, water repellency can be imparted also to a silicon oxide layer by a plasma-enhanced CVD method with changed conditions for forming the insulating layer (e.g. the flow ratio of a silicon raw material gas to an oxygen raw material gas introduced into a deposition chamber) as described in detail in the Examples section later.

In the present invention, an insulating layer removing step may be carried out after forming the collecting electrode (plating step). In particular, when a material having large optical absorption is used as the insulating layer, the insulating layer removing step is preferably carried out for suppressing reduction of solar cell characteristics by the optical absorption of the insulating layer. The method for removing the insulating layer is appropriately selected according to the characteristics of the insulating layer material. For example, the insulating layer can be removed by chemical etching or mechanical polishing. An ashing (incineration) method is also applicable depending on the material. At this time, it is preferable that the insulating layer on the first electroconductive layer-non-formed region is entirely removed, so that an influx of light is further improved. When the water-repellent layer 91 is formed on the insulating layer 9, the water-repellent layer 91 is preferably removed together with the insulating layer 9. When a material having small optical absorption is used as the insulating layer, it is not necessary to carry out the insulating layer removing step.

Explanations have been provided principally for the case of providing the collecting electrode 70 on the light incident side of the heterojunction solar cell, but a similar collecting electrode may also be formed on the back side. A solar cell using a crystalline silicon substrate, like the heterojunction solar cell, has a high current value, so that generally the electricity generation loss due to a loss of contact resistance between the transparent electrode layer and the collecting electrode tends to be remarkable. In contrast, in the present invention, the collecting electrode having the first electroconductive layer and the second electroconductive layer has low contact resistance with the transparent electrode layer, thus making it possible to reduce the electricity generation loss resulting from contact resistance.

The present invention is applicable to various kinds of solar cells such as: crystalline silicon solar cells other than the heterojunction solar cell; solar cells using a semiconductor substrate other than silicon, such as GaAs; silicon-based thin-film solar cells having a transparent electrode layer on a pin junction or a pn junction of an amorphous silicon-based thin-film or a crystalline silicon-based thin-film, compound semiconductor solar cells such as CIS and CIGS; and organic thin-film solar cells, such as dye-sensitized solar cells and organic thin-film (electroconductive polymer).

The crystalline silicon solar cell includes a configuration in which a diffusion layer of an opposite conductivity type (e.g. n-type) is provided on one main surface of a crystalline silicon substrate of a first conductivity type (e.g. p-type), and the collecting electrode is provided on the diffusion layer. This crystalline silicon solar cell generally includes a conductive layer such as a p+ layer on a side opposite to the layer of the first conductivity type. Thus, when the photoelectric conversion section does not include an amorphous silicon layer or a transparent electrode layer, the thermal-fluidization onset temperature $T_1$ of the low-melting-point material and the annealing temperature Ta may be higher than 250° C.

Examples of the silicon-based thin-film solar cell include an amorphous silicon-based thin-film solar cell having an amorphous intrinsic (i-type) silicon thin-film between a p-type thin-film and an n-type thin-film, and a crystalline silicon-based semiconductor solar cell having a crystalline intrinsic silicon thin-film between a p-type thin-film and an n-type thin-film. A tandem-type thin-film solar cell, in which a plurality of pin junctions is stacked, is also suitable. In this silicon-based thin-film solar cell, the thermal-fluidization onset temperature $T_1$ of the low-melting-point material and the annealing temperature Ta are preferably 250° C. or lower, more preferably 200° C. or lower, further preferably 180° C. or lower, in consideration of the heat resistance of the transparent electrode layer and the amorphous silicon-based thin-film.

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization.

EXAMPLES

The present invention will be more specifically described below by showing examples relating to the heterojunction solar cell shown in FIG. 2, but the present invention is not limited to the Examples below.

Example 1

A heterojunction solar cell of Example 1 was manufactured in the following manner.

An n-type single-crystal silicon wafer having a light incident surface direction identical to the (100) surface and having a thickness of 200 μm was provided as a single-crystal silicon substrate of a first conductivity type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water. The surface of the wafer was observed using an atomic force microscope (AFM manufactured by Pacific Nanotechnology, Inc.), and it was confirmed that the surface of the wafer was etched, and a pyramidal texture surface exposed at the (111) plane was formed.

The wafer after etching was introduced into a CVD apparatus, and at the light incident side thereof, i-type amorphous silicon was formed with a thickness of 5 nm as an intrinsic silicon-based thin-film 2a. Conditions for forming i-type amorphous silicon included a substrate temperature of 150° C., a pressure of 120 Pa, a $SiH_4/H_2$ flow ratio of 3/10 and a power density supply of 0.011 $W/cm^2$. The thickness of the thin-film in this example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer 2a, p-type amorphous silicon was formed with a thickness of 7 nm as a silicon-based thin-film 3a of an opposite conductivity type. Conditions for forming the p-type amorphous silicon layer 3a included a substrate temperature of 150° C., a pressure of 60 Pa, a $SiH_4/B_2H_6$ flow ratio of 1/3 and a power density supply of 0.01 $W/cm^2$. The $B_2H_6$ gas flow rate mentioned above is a flow rate of a diluting gas wherein $B_2H_6$ concentration was diluted to 5000 ppm using $H_2$ gas.

Thereafter, on the back side of the wafer, an i-type amorphous silicon layer was formed with a thickness of 6 nm as an intrinsic silicon-based thin-film 2b. Conditions for forming the i-type amorphous silicon layer 2b were the same as those for the aforementioned i-type amorphous silicon layer 2a. On the i-type amorphous silicon layer 2b, an n-type amorphous silicon layer was formed with a thickness of 4 nm as a silicon-based thin-film 3b of the first conductivity type. Conditions for forming the n-type amorphous silicon layer 3b included a substrate temperature of 150° C., a pressure of 60 Pa, a $SiH_4/PH_3$ flow ratio of 1/2 and a power density supply of 0.01 $W/cm^2$. The $PH_3$ gas flow rate mentioned above is a flow rate of a diluting gas wherein $PH_3$ concentration was diluted to 5000 ppm using $H_2$ gas.

Indium tin oxide (ITO, refractive index: 1.9) was formed thereon with a thickness of 100 nm as transparent electrode layers 6a and 6b, respectively. The transparent electrode layer was formed by applying a power density of 0.5 $W/cm^2$ in an argon atmosphere at a substrate temperature of room temperature and a pressure of 0.2 Pa using indium oxide as a target. On the back side transparent electrode layer 6b, silver was formed with a thickness of 500 nm as a back side metal electrode 8 by a sputtering method. A collecting electrode 70 having a first electroconductive layer 71 and a second electroconductive layer 72 was formed on the light incident side transparent electrode layer 6a in the following manner.

For formation of the first electroconductive layer 71, a printing paste containing SnBi metal powder (particle size $D_L$=25 to 35 µm; melting point $T_1$=141° C.) as a low-melting-point material and a silver powder (particle size $D_H$=2 to 3 µm; melting point $T_2$=971° C.) as a high melting-point material at a weight ratio of 20:80, and further containing an epoxy-based resin as a binder resin was used. The printing paste was screen-printed using a screen plate of #230 mesh (opening width: 1=85 µm) having an opening width (L=80 µm) matching a collecting electrode pattern, and dried at 90° C.

Figure 10:
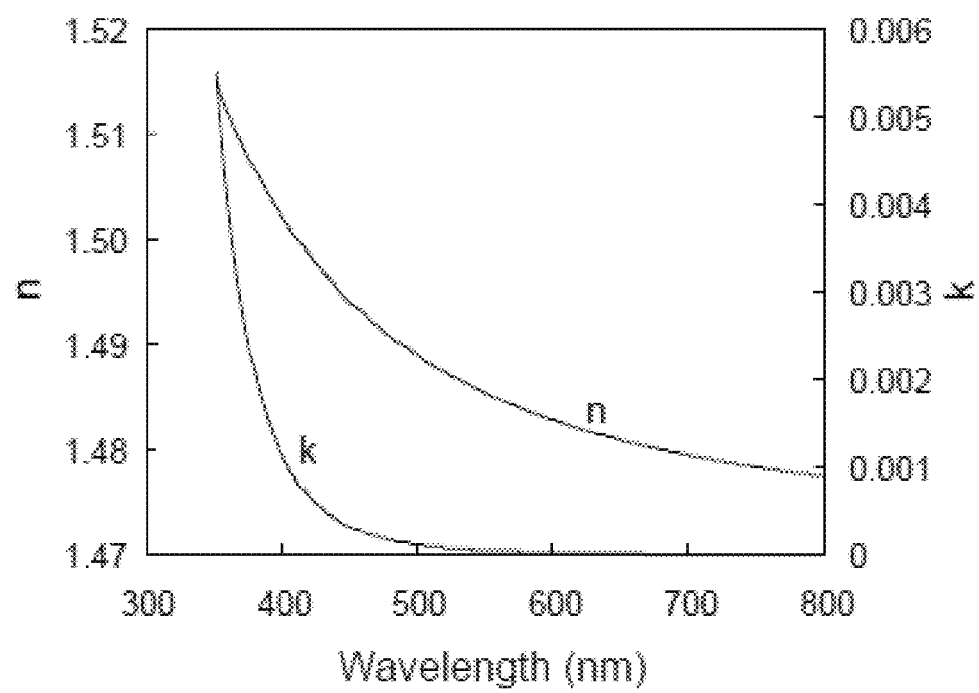
FIG. 10 is a view showing optical characteristics of an insulating layer in Examples.

The wafer with the first electroconductive layer 71 formed thereon was introduced into a CVD apparatus, and a silicon oxide layer (refractive index: 1.5) was formed on the light incident surface side with a thickness of 80 nm as an insulating layer 9 by a plasma-enhanced CVD method. Conditions for forming the insulating layer 9 included a substrate temperature of 135° C., a pressure of 133 Pa, a $SiH_4/CO_2$ flow ratio of 1/20 and a power density supply of 0.05 $W/cm^2$ (frequency 13.56 MHz). The refractive index (n) and extinction coefficient (k) of the insulating layer formed on the light incident side under the conditions were as shown FIG. 10. Thereafter, the wafer after formation of the insulating layer was introduced into a circulating hot air oven, and subjected to an annealing treatment at 180° C. for 20 minutes in an air atmosphere.

The substrate 12 subjected to steps up to and including the annealing step as described above was introduced into a plating tank 11 as shown in FIG. 7. For a plating solution 16, one obtained by adding additives (product numbers: ESY-2B, ESY-H and ESY-1A, manufactured by Uyemura & CO., LTD.) to a solution prepared so that the concentrations of copper sulfate pentahydrate, sulfuric acid and sodium chloride were 120 g/l, 150 g/l and 70 mg/l, respectively, was used. Using the plating solution, plating was carried out under conditions including a temperature of 40° C. and a current of 3 $A/dm^2$, so that on the insulating layer on the first electroconductive layer 71, copper was uniformly deposited at a thickness of about 10 µm as a second electroconductive layer 72. Little copper was deposited onto a region where no first electroconductive layer was formed.

Thereafter, the silicon wafer on the cell outer periphery was removed in a width of 0.5 mm by a laser processing apparatus to prepare the heterojunction solar cell of the present invention.

Examples 2 to 4

A heterojunction solar cell was prepared in the same manner as in Example 1 except that the ratio of a metallic material powder to a silver powder in the printing paste for forming the first electroconductive layer 71 was changed as shown in Table 1.

Examples 5 and 6

A heterojunction solar cell was prepared in the same manner as in Example 1 except that the thickness of the insulating layer 9 was changed as shown in Table 1.

Example 7

A heterojunction solar cell was prepared in the same manner as in Example 1 except that the annealing temperature was changed to 160° C.

Example 8

A heterojunction solar cell was prepared in the same manner as in Example 1 except that the annealing temperature was changed to 200° C.

Example 9

A heterojunction solar cell was prepared in the same manner as in Example 1 except that the annealing temperature was changed to 230° C. and that the annealing period was changed to 10 minutes.

Example 10

A heterojunction solar cell was prepared in the same manner as in Example 1 except that the low-melting-point material in the printing paste for forming the first electroconductive layer 71 was changed to an indium metallic powder (particle size $D_L$=40 µm; melting point $T_1$=154° C.).

Example 11

A heterojunction solar cell was prepared in the same manner as in Example 1 except that as the insulating layer 9, an $Al_2O_3$ layer was formed, in place of a silicon oxide layer, with a thickness of 200 nm by an EB vapor deposition method.

Example 12

A heterojunction solar cell was prepared in the same manner as in Example 11 except that a step of washing by an ultrasonic washer (removing a plating solution) was provided after the second electroconductive layer 72 was formed by plating in Example 11.

Example 13

A heterojunction solar cell was prepared in the same manner as in Example 1 except that as the insulating layer 9, a silicon oxide layer was formed with a thickness of 200 nm by a sputtering method.

Example 14

A heterojunction solar cell was prepared in the same manner as in Example 1 except that the low-melting-point material in the printing paste for forming the first electroconductive layer 71 was changed to silver fine particle having a particle size $D_L$ of 0.3 to 0.7 µm, and no high-melting-point material was used.

Example 15

A heterojunction solar cell was prepared in the same manner as in Example 1 except that the high-melting-point material in the printing paste for forming the first electroconductive layer 71 was changed to a mixture of a silver powder (particle size: 2 to 3 µm; melting point: 971° C.) and an aluminum powder (particle size: 2 to 4 µm; melting point: 933° C.) at a weight ratio of 60:40.

Comparative Example 1

Steps up to and including formation of the first electroconductive layer (silver electrode) 71 were carried out in the same manner as in Example 1 except that a silver paste containing no low-melting-point material (i.e. the ratio of a metallic material powder to a silver powder was 0:100) was used as a printing paste for forming a first electroconductive layer. Thereafter, a heterojunction solar cell having this silver electrode as a collecting electrode was prepared without carrying out any of an insulating layer forming step, an annealing step and a second electroconductive layer forming step.

Comparative Example 2

After the first electroconductive layer and the insulating layer were formed in Example 1, an attempt was made to form a second electroconductive layer by a plating method without carrying out an annealing step, but copper was not deposited, and the second electroconductive layer was not formed.

Comparative Example 3

Steps up to and including formation of a first electroconductive layer and formation of an insulating layer were carried out in the same manner as in Example 1 except that the low-melting-point material in the printing paste for forming the first electroconductive layer 71 was changed to a SnSb powder (particle size $D_L$=35 to 45 µm; melting point $T_1$=266° C.). Thereafter, an attempt was made to form a second electroconductive layer by a plating method as in Example 1, but copper was not deposited, and the second electroconductive layer was not formed.

Comparative Example 4

A heterojunction solar cell was prepared in the same manner as in Comparative Example 3 except that the annealing temperature was changed to 300° C. In Comparative Example 4, copper was deposited onto a first electroconductive layer-formed region of an insulating layer in a plating step, so that a second electroconductive layer was formed.

Comparative Example 5

After the first electroconductive layer was formed in Example 1, a second electroconductive layer was formed by a plating method without carrying out an insulating layer forming step and an annealing step. In Comparative Example 5, the second electroconductive layer could be formed, but such a problem arose that a transparent electrode layer was fully etched during a plating treatment, and an article functioning as a solar cell was not obtained.

Preparation conditions and results of measurements of solar cell characteristics (open voltage (Voc), short circuit current density (Jsc), fill factor (F.F.) and conversion efficiency (Eff.)) for the heterojunction solar cells of examples and comparative examples described above are shown in Table 1.

TABLE 1

| | first electrode layer | | | | | insulating layer | | | annealing | plating | solar cell properties | | | | plating solution |
|---|---|---|---|---|---|---|---|---|---|---|---|---|---|---|---|
| | low-melting-point material | $T_1$ (° C.) | diameter $D_L$ (µm) | high-melting-point material | $T_2$ (° C.) | weight ratio of low-melting-point material | material | deposition method | thickness (nm) | temperature (° C.) | plating step | Voc (V) | Jsc (mA/cm²) | FF (%) | Eff (%) | removing step |
| Example 1 | SnBi | 141 | 25-35 | Ag | 971 | 20 | SiO₂ | CVD | 80 | 180 | yes | 0.715 | 36.5 | 76.0 | 19.8 | — |
| Example 2 | SnBi | 141 | 25-35 | Ag | 971 | 5 | SiO₂ | CVD | 80 | 180 | yes | 0.715 | 36.5 | 75.5 | 19.7 | — |
| Example 3 | SnBi | 141 | 25-35 | Ag | 971 | 10 | SiO₂ | CVD | 80 | 180 | yes | 0.715 | 36.5 | 75.8 | 19.8 | — |
| Example 4 | SnBi | 141 | 25-35 | Ag | 971 | 40 | SiO₂ | CVD | 80 | 180 | yes | 0.715 | 36.5 | 75.2 | 19.6 | — |
| Example 5 | SnBi | 141 | 25-35 | Ag | 971 | 20 | SiO₂ | CVD | 50 | 180 | yes | 0.715 | 36.3 | 76.0 | 19.7 | — |
| Example 6 | SnBi | 141 | 25-35 | Ag | 971 | 20 | SiO₂ | CVD | 200 | 180 | yes | 0.715 | 36.0 | 76.0 | 19.6 | — |
| Example 7 | SnBi | 141 | 25-35 | Ag | 971 | 20 | SiO₂ | CVD | 80 | 160 | yes | 0.715 | 36.5 | 76.0 | 19.8 | — |
| Example 8 | SnBi | 141 | 25-35 | Ag | 971 | 20 | SiO₂ | CVD | 80 | 200 | yes | 0.715 | 36.5 | 75.6 | 19.7 | — |
| Example 9 | SnBi | 141 | 25-35 | Ag | 971 | 20 | SiO₂ | CVD | 80 | 230 | yes | 0.713 | 36.2 | 75.2 | 19.4 | — |
| Example 10 | In | 156 | 40 | Ag | 971 | 20 | SiO₂ | CVD | 80 | 180 | yes | 0.715 | 36.5 | 76.0 | 19.8 | — |
| Example 11 | SnBi | 141 | 25-35 | Ag | 971 | 20 | Al₂O₃ | EB | 200 | 180 | yes | 0.715 | 36.1 | 76.0 | 19.6 | — |

TABLE 1-continued

| | first electrode layer | | | | | insulating layer | | | annealing | plating step | solar cell properties | | | | plating solution removing step |
|---|---|---|---|---|---|---|---|---|---|---|---|---|---|---|---|
| | low-melting-point material | $T_1$ (° C.) | diameter $D_L$ (μm) | high-melting-point material | $T_2$ (° C.) | weight ratio of low-melting-point material | material | deposition method | thickness (nm) | temperature (° C.) | | Voc (V) | Jsc (mA/cm²) | FF (%) | Eff (%) | |
| Example 12 | SnBi | 141 | 25-35 | Ag | 971 | 20 | $Al_2O_3$ | EB | 200 | 180 | yes | 0.715 | 36.2 | 76.0 | 19.7 | ultrasonic |
| Example 13 | SnBi | 141 | 25-35 | Ag | 971 | 20 | $SiO_2$ | sputter | 200 | 180 | yes | 0.715 | 36.0 | 76.0 | 19.6 | — |
| Example 14 | Ag fine particle | 150 | 0.3-0.7 | — | — | 100 | $SiO_2$ | CVD | 80 | 180 | yes | 0.715 | 36.5 | 76.0 | 19.8 | — |
| Example 15 | SnBi | 141 | 25-35 | Ag/Al | 971/933 | 20 | $SiO_2$ | CVD | 80 | 180 | yes | 0.715 | 36.5 | 75.8 | 19.8 | — |
| Comparative Example 1 | — | — | — | Ag | 971 | 0 | — | — | — | — | — | 0.718 | 35.9 | 74.5 | 19.2 | — |
| Comparative Example 2 | SnBi | 141 | 25-35 | Ag | 971 | 20 | $SiO_2$ | CVD | 120 | — | — | not evaluated | | | | — |
| Comparative Example 3 | Sn—Sb | 266 | 35-45 | Ag | 971 | 20 | $SiO_2$ | CVD | 120 | 180 | yes | not evaluated | | | | — |
| Comparative Example 4 | Sn—Sb | 266 | 35-45 | Ag | 971 | 20 | $SiO_2$ | CVD | 120 | 300 | yes | 0.674 | 36.0 | 69.2 | 16.8 | — |
| Comparative Example 5 | SnBi | 141 | 25-35 | Ag | 971 | 20 | — | — | — | — | yes | not evaluated | | | | — |

As is apparent from comparison between the Examples and Comparative Example 1, the solar cell of the present invention has improved conversion efficiency (Eff.) as compared to a conventional solar cell having a collecting electrode composed of a silver paste electrode. This is considered to be because the resistance of the collecting electrode decreased, so that the fill factor (F.F.) was improved in the solar cells of the Examples.

In the Examples, the short circuit current density (Jsc) was also improved as compared to Comparative Example 1. This is considered to be because the reflectivity at the outermost surface (air interface of the solar cell) decreased as the insulating layer 9 having a low refractive index was provided on the transparent electrode layer 6a having a high refractive index. This can also be concluded from the fact that in FIG. 10, the insulating layer (silicon oxide) has a refractive index lower than that of the transparent electrode layer (ITO) and has little optical absorption in such a wavelength range that the solar cell can be utilized for photoelectric conversion. Thus, it is apparent that when an insulating layer having transparency and an appropriate refractive index is formed, a solar cell having a high conversion characteristic is obtained even if the insulating layer is not removed after formation of the second electroconductive layer.

The reason why copper was deposited as the second electroconductive layer by the plating step in examples is that an opening section was formed in the insulating layer on the first electroconductive layer-formed region by the annealing treatment, the first electroconductive layer contacted (was conductively connected with) the plating solution, and plating was performed with the opening section as an origination point for deposition. On the other hand, an origination point for plating was absent on the insulating layer, so that the second electroconductive layer was not formed, in Comparative Example 2 because the annealing treatment was not carried out and in Comparative Example 3 because the annealing temperature Ta (180° C.) was lower than the thermal-fluidization onset temperature $T_1$ (266° C.) of the low-melting-point material.

In Comparative Example 4, the annealing temperature Ta (300° C.) was higher than the thermal-fluidization onset temperature $T_1$ (266° C.) of the low-melting-point material, and therefore the second electroconductive layer was formed, but solar cell characteristics were significantly reduced due to heating at a high temperature of 300° C. This is considered to be because heating at a high temperature caused reduction of characteristics (film quality) of the amorphous silicon layer of the photoelectric conversion section.

From the above results, it is apparent that the annealing temperature Ta should be equal to or higher than the thermal-fluidization onset temperature $T_1$ of the low-melting-point material, and lower than the heat-resistant temperature of the photoelectric conversion section, and accordingly the thermal-fluidization onset temperature $T_1$ of the low-melting-point material should be made lower than the heat-resistant temperature of the photoelectric conversion section.

When making a comparison for the content of the low-melting-point material in the first electroconductive layer, the F.F. is increased in Example 1 (weight ratio of 20) as compared to Example 2 (weight ratio of 5) and Example 3 (weight ratio of 10). This is considered to be because due to an increase in the low-melting-point material, the area of the opening section formed on the insulating layer by the annealing step was increased, so that the number of origination points for copper deposition in the plating step was increased, and therefore the uniformity of the thickness of the second electroconductive layer (metallic layer) was improved, leading to reduction of resistance.

On the other hand, when comparing Example 1 with Example 4, Example 1, of which content of the low-melting-point material is low (weight ratio of 20), shows a F.F. higher than that of Example 4 (weight ratio of 40). This is considered to be because the resistance of the first electroconductive layer was elevated as the content of the low-melting-point material was increased. According to the results of Examples 1 to 4 described above, it is considered that when the first electroconductive layer contains the low-melting-point material and the high-melting-point material, the optimum content of the low-melting-point material is about 20 parts by weight based on 100 parts by weight of the total of the low-melting-point material and the high-melting-point material from the viewpoints of the number of origination points for metal deposition and reduction of resistance.

When making a comparison for the thickness of the insulating layer, Example 1 (80 nm) has a higher Jsc and an improved Eff. as compared to Example 5 (50 nm) and Example 6 (200 nm). This is considered to be because an insulating layer having a thickness of about 80 nm more easily functions as an anti-reflection layer, leading to an increase in the amount of light introduced into the photoelectric conversion section.

When making a comparison for the material of the insulating layer and the method for formation thereof, the solar cell characteristics of Example 6 ($SiO_2$; CVD), Example 11 ($Al_2O_3$; EB) and Example 13 ($SiO_2$; sputtering) were comparable. This is considered to be because when the thickness of the insulating layer was about 200 nm, a densified film was prepared in any of the CVD method, the sputtering method and the EB method.

When making a comparison for the temperature of the annealing step, Example 1 (180° C.) and Example 7 (160° C.) have a higher F.F. and other characteristics, and an improved Eff. as compared to Example 8 (200° C.) and Example 9 (230° C.). This is considered to be because as a result of carrying out the annealing step at a temperature lower by 50° C. or more than the heat-resistant temperature (250° C.) of the photoelectric conversion section, reduction of the characteristics of the photoelectric conversion section (transparent electrode layer or amorphous silicon layer) in the annealing step was suppressed.

Example 10, in which indium having a melting point $T_1$ of 156° C. was used as the low-melting-point material, showed high conversion efficiency comparable to that of Example 1. This is considered to be because the annealing was carried out at a temperature higher than the melting point of the low-melting-point material and sufficiently lower than the heat-resistant temperature of the photoelectric conversion section as in Example 1.

In Example 14, only silver, which is a high-melting-point material, was used as the material of the first electroconductive layer, but the second electroconductive layer was formed on the first electroconductive layer-formed region of the insulating layer as in Example 1. The solar cell of Example 14 has a conversion efficiency comparable to that of Example 1. This is considered to be because silver fine particles having a small particle size $D_L$ of 0.3 to 0.7 μm have a thermal-fluidization onset temperature (sintering-necking onset temperature) $T_1$ of 150° C. that is considerably lower than the melting point (971° C.), leading to occurrence of necking at the annealing temperature Ta (180° C.). It can be said from this result that even a material having a high melting point undergoes sintering-necking at a low temperature by decreasing the particle size of fine particles, and therefore can be used as the "low-melting-point material" of the present invention.

Example 15, in which a mixture of silver and aluminum was used as the high-melting-point material, had an F.F. slightly lower than that of Example 1. This is considered to be because aluminum has an electroconductivity lower than that of silver, and therefore the resistivity of the first electroconductive layer increased. However, since the current passes principally through the second electroconductive layer, a reduction in F.F. associated with an increase in resistivity of the first electroconductive layer is only slight in Example 15. Therefore, it can be said that if the used amount of silver is reduced by using aluminum or the like as the high-melting-point material, manufacturing costs can be reduced without significantly impairing the characteristics of the solar cell.

Example 12, in which the plating solution was removed by ultrasonic washing after carrying out the plating step, had a Jsc higher than that of Example 11. This is considered to be because by performing washing, microsized copper deposited on areas of the surface other than the collecting electrode forming region was removed, so that the shading loss was reduced, leading to an increase in the amount of light incident to the photoelectric conversion section.

Hereinbelow, heterojunction solar cells of Reference Example 1 and Examples 16 to 20 were prepared for examining the contact angle of the surface of the insulating layer with water and the deposited amount of copper after carrying out the plating step.

Reference Example 1

In Reference Example 1, steps up to and including formation of a photoelectric conversion section and formation of a first electroconductive layer 71 were carried out in the same manner as in Example 1 except that the substrate temperature during formation of the i-type amorphous silicon layer 2 was changed to 170° C., and the thickness of the n-type amorphous silicon layer 3b was changed to 8 nm. Thereafter, the wafer with the first electroconductive layer 71 formed thereon was introduced into a CVD apparatus, and a silicon oxide layer (refractive index: 1.5) was formed on the light incident surface side with a thickness of 80 nm as an insulating layer 9 by a CVD method.

Conditions for forming the insulating layer 9 included a substrate temperature of 135° C., a pressure of 133 Pa, a $SiH_4/CO_2$ flow ratio of 1/10 and a power density supply of 0.05 W/cm$^2$ (frequency 13.56 MHz) (hereinafter, the condition for forming the insulating layer is referred to as "condition C"). The contact angle of the insulating layer 9 with water in the first electroconductive layer-non-formed region was measured by a contact angle meter (Model CA-VP300 manufactured by Kyowa Interface Science Co., LTD.) to find that the contact angle θ was 5 to 15°. After forming the insulating layer, an annealing step and a second electroconductive layer forming step (plating step) were carried out in the same manner as in Example 1.

After carrying out the plating step, a plating solution stuck to the surface of a substrate 12 was blown off by an air knife, followed by measuring the weight of copper remaining on the surface of the substrate 12. In this measurement, first, the substrate 12 was immersed in a flat-bottom beaker containing a predetermined amount (50 mL) of pure water for 20 minutes, whereby copper remaining on the surface of the substrate 12 was eluted in water within the beaker. Thereafter, a predetermined amount of water within the beaker was drawn off, and caused to develop a color with a predetermined amount of bathocuproinedisulfonic acid, and the color was compared to a standard sample to thereby perform quantification. The residual amount of copper calculated by this measurement was 0.1 mg.

Thereafter, the silicon wafer on the cell outer periphery was removed in a width of 0.5 mm by a laser processing machine.

Example 16

A heterojunction solar cell was prepared in the same manner as in Reference Example 1 except that a water-repellent layer was provided on the surface of the substrate 12 after formation of the insulating layer and before the annealing treatment. The water-repellent layer was formed by immersing the substrate 12 for 1 minute in a water-repellent treatment material solution of tetradecylsulfonic acid (material A) dissolved in isopropyl alcohol at a concentration of $0.5\times10^{-3}$ mol/L. In this Example, the annealing step (heating at 180° C. for 20 minutes) has a role of drying the water-repellent layer.

The contact angle θ of the substrate with water in the first electroconductive layer-non-formed region was 80° to 90°, and it was confirmed that the water-repellent layer was formed on the surface of the substrate 12. The time required for depositing copper (the second electroconductive layer) with a thickness of about 10 μm in the plating step was comparable to that in Reference Example 1. There was no change in contact angle with water in the first electroconductive layer-non-formed region before and after carrying out the plating step.

Example 17

A heterojunction solar cell was prepared in the same manner as in Example 16 except that the time of immersion in the water-repellent treatment material solution was changed to 5 minutes. The contact angle θ of the substrate surface with water before carrying out the plating step was 110° to 120°, and there was no change in contact angle with water before and after carrying out the plating step. The time required for depositing copper (the second electroconductive layer) with a thickness of about 10 μm in the plating step was about 2 times as long as that in Reference Example 1.

Example 18

A heterojunction solar cell was prepared in the same manner as in Example 17 except that benzoylsulfonic acid (material B) was used as the water-repellent treatment material. The contact angle θ of the substrate surface with water before carrying out the plating step was 60° to 70°, and there was no change in contact angle with water before and after carrying out the plating step. The time required for depositing copper (the second electroconductive layer) with a thickness of about 10 μm in the plating step was about 1.3 times as long as that in Reference Example 1.

Example 19

A heterojunction solar cell was prepared in the same manner as in Example 18 except that the time of immersion in the water-repellent treatment material solution was changed to 1 minute. The contact angle θ of the substrate surface with water before carrying out the plating step was 20° to 30°, and there was no change in contact angle with water before and after carrying out the plating step. The time required for depositing copper (the second electroconductive layer) with a thickness of about 10 μm in the plating step was comparable to that in Reference Example 1.

Example 20

A heterojunction solar cell was prepared in the same manner as in Reference Example 1 except that conditions for forming a silicon oxide layer were changed to include a substrate temperature of 135° C., a pressure of 133 Pa, a $SiH_4/CO_2$ flow ratio of 1/3 and a power density supply of 0.15 $W/cm^2$ (frequency 27 MHz) (hereinafter, the condition for forming the insulating layer is referred to as "condition D"). The contact angle θ of the substrate surface with water before carrying out the plating step was 60° to 70°, and there was no change in contact angle with water before and after carrying out the plating step. The time required for depositing copper (the second electroconductive layer) with a thickness of about 10 μm in the plating step was comparable to that in Reference Example 1.

Comparative Example 6

A heterojunction solar cell was prepared in the same manner as in Example 16 except that no insulating layer was formed, and a water-repellent layer was formed directly on the transparent electrode layer 6a. In Comparative Example 6, such a problem did not arise that the transparent electrode layer was fully etched as in Comparative Example 5 described above, but such a problem arose that the second electroconductive layer was formed on almost the entire surface of the first electroconductive layer-non-formed region of the transparent electrode layer, and an article functioning as a solar cell was not obtained.

The heterojunction solar cells were prepared in the manner described above. Preparation conditions, results of measurements of solar cell characteristics, and the weight of copper on the substrate surface after carrying out the plating step, determined in the same manner as in Reference Example 1, for the heterojunction solar cells of the Reference Examples and Examples described above are shown in Table 2. In Examples 16 to 18 and Example 20, the residual amount of copper was equal to or less than a detection limit (0.05 mg).

TABLE 2

| | first electrode layer | | | insulating layer | | water repellent treatment | | | annealing temperature (° C.) | time for depositing copper (relative value) | residual amount of copper (mg) | solar cell properties | | | |
|---|---|---|---|---|---|---|---|---|---|---|---|---|---|---|---|
| | low-melting-point material | $T_1$ (° C.) | diameter $D_L$ (μm) | material | deposition condition | material | time (minute) | contact angle (°) | | | | Voc (V) | Jsc (mA/$cm^2$) | FF (%) | Eff (%) |
| Reference Example 1 | SnBi | 141 | 25-35 | $SiO_2$ | C | — | — | 5-15 | 180 | 1 | 0.1 | 0.718 | 36.5 | 76.5 | 20.0 |
| Example 16 | SnBi | 141 | 25-35 | $SiO_2$ | C | A | 1 | 80-90 | 180 | 1 | ≤0.05 | 0.718 | 36.5 | 76.5 | 20.0 |
| Example 17 | SnBi | 141 | 25-35 | $SiO_2$ | C | A | 5 | 110-120 | 180 | 2 | ≤0.05 | 0.718 | 36.5 | 76.5 | 20.0 |
| Example 18 | SnBi | 141 | 25-35 | $SiO_2$ | C | B | 5 | 60-70 | 180 | 1.3 | ≤0.05 | 0.718 | 36.5 | 76.5 | 20.0 |
| Example 19 | SnBi | 141 | 25-35 | $SiO_2$ | C | B | 1 | 20-30 | 180 | 1 | 0.08 | 0.718 | 36.5 | 76.5 | 20.0 |
| Example 20 | SnBi | 141 | 25-35 | $SiO_2$ | D | — | — | 60-70 | 180 | 1.3 | ≤0.05 | 0.718 | 36.5 | 76.5 | 20.0 |

TABLE 2-continued

| | first electrode layer | | | insulating layer | | water repellent treatment | | | annealing temperature (° C.) | time for depositing copper (relative value) | residual amount of copper (mg) | solar cell properties | | | |
|---|---|---|---|---|---|---|---|---|---|---|---|---|---|---|---|
| | low-melting-point material | $T_1$ (° C.) | diameter $D_L$ (μm) | material | deposition condition | material | time (minute) | contact angle (°) | | | | Voc (V) | Jsc (mA/cm²) | FF (%) | Eff (%) |
| Comparative Example 6 | SnBi | 141 | 25-35 | — | — | A | 1 | — | — | — | — | not evaluated | | | |

As shown in Table 2, the characteristics of the solar cells of Reference Example 1 and Examples 16 to 20 were comparable, and heterojunction solar cells having a high conversion characteristic were obtained as in Examples 1 to 15 described above.

Examples 16 to 19 confirmed an effect by applying a water-repellent layer to the surface of the insulating layer of Reference Example 1 to increase the contact angle with water. Comparison of the weights of remaining copper in Example 16 and Reference Example 1 showed that the amount of copper remaining on the surface of the substrate 12 after being taken out from a plating tank could be reduced by carrying out a water-repellent treatment. Since there was no difference in Jsc between Example 16 and Reference Example 1, it was confirmed that the water-repellent layer was formed without causing an optical loss.

According to Examples 16 to 19, it is considered that the contact angle θ is desired to be 50° or more, in order to reduce the residual amount of copper. On the other hand, it is apparent that the contact angle θ is desired to be 120° or less for achieving high plating efficiency. Thus, it is apparent that when the contact angle is in a range of 50° to 120°, the residual amount of copper can be reduced, and also high plating efficiency can be achieved.

From comparison between Reference Example 1 and Example 20, it is apparent that by changing conditions for forming the silicon oxide layer, the contact angle of the silicon oxide layer with water can be changed, and the contact angle described above can be achieved even if the water-repellent layer is not provided.

Factors causing the contact angle of the silicon oxide layer with water to be changed according to formation conditions may include the composition ratio of silicon, oxygen and hydrogen on the surface of the silicon oxide layer and a change in fine surface structure. There is a difference in flow ratio of $SiH_4$ to $CO_2$, frequency of radio frequency and power density between Reference Example 1 and Example 20. It is concluded that due to the differences described above, a plasma state during formation by the plasma-enhanced CVD method was changed, and resultantly the ratio of silicon to oxygen in the silicon oxide layer was changed.

As to a cause of occurrence of the problem that copper is deposited on the entire surface of the transparent electrode layer in Comparative Example 6, it is conceived that due to the presence of an uneven structure on the surface of the solar cell, the water-repellent layer was not uniformly formed on the entire surface of the photoelectric conversion section 50 (transparent electrode layer 6a), a water-repellent layer-non-formed region such as a pinhole was present, and copper was plated with the non-formed region as an origination point. Comparative Example 6 corresponds to the aforementioned method described in Non-Patent Document 1. From this result, it is considered that the method described in Non-Patent Document 1 is difficult to apply to a solar cell having an unevenness on the surface, like the heterojunction solar cell shown in FIG. 2.

From comparison between Comparative Example 5 and Comparative Example 6, it is apparent that although the water-repellent layer is suggested to have an effect of protecting the transparent electrode layer from erosion by a plating solution, the protective effect is insufficient from the viewpoint of preventing deposition of a metal by plating.

As described above by showing Examples, according to the present invention, a collecting electrode of a solar cell can be prepared without patterning an insulating layer, thus making it possible to provide a high-power solar cell at low costs.

DESCRIPTION OF REFERENCE CHARACTERS

1 single-crystal silicon substrate of a first conductivity type
2a, 2b intrinsic silicon-based thin-film
3a, 3b conductive silicon-based thin-film
6a, 6b transparent electrode layer
70 collecting electrode
71 first electroconductive layer
711 low-melting-point material
72 second electroconductive layer
8 back side metal electrode
9 insulating layer
91 water-repellent layer
9h opening section
9x pinhole
50 photoelectric conversion section
100 solar cell
101 heterojunction solar cell
10 plating apparatus
11 plating tank
12 substrate
13 anode
14 substrate holder
15 power source
16 plating solution

The invention claimed is:

1. A solar cell comprising: a photoelectric conversion section; and a collecting electrode on one main surface of the photoelectric conversion section, wherein
the collecting electrode includes a first electroconductive layer and a second electroconductive layer in this order from a photoelectric conversion section side, and further includes an insulating layer between the first electroconductive layer and the second electroconductive layer, wherein an opening section is formed in the insulating layer;
the first electroconductive layer is covered with the insulating layer;

the first electroconductive layer includes a first-melting-point material and a second-melting-point material, a thermal-fluidization onset temperature $T_1$ of the first-melting-point material is lower than a heat-resistant temperature of the photoelectric conversion section, and a thermal-fluidization onset temperature $T_2$ of the second-melting-point material is higher than $T_1$, and a part of the second electroconductive layer is conductively connected with the first electroconductive layer through the opening section of the insulating layer, wherein the first-melting-point material includes a metallic material.

2. The solar cell according to claim 1, wherein the photoelectric conversion section comprises a silicon-based thin-film and a transparent electrode layer in this order on one main surface of a crystalline silicon substrate of a first conductivity type, the collecting electrode is provided on the transparent electrode layer, and the thermal-fluidization onset temperature $T_1$ of the first-melting-point material is 250° C. or lower.

3. The solar cell according to claim 2, wherein the photoelectric conversion section comprises a diffusion layer of an opposite conductivity type on the one main surface of the crystalline silicon substrate of the first conductivity type, and the collecting electrode is provided on the diffusion layer.

4. The solar cell according to claim 1, wherein the photoelectric conversion section comprises a transparent electrode layer on one main surface of a pn junction or a pin junction of a semiconductor thin-film, and the collecting electrode is provided on the transparent electrode layer.

5. The solar cell according to claim 1, wherein the insulating layer is also formed on a first electroconductive layer-non-formed region of the photoelectric conversion section.

6. The solar cell according to claim 5, wherein a contact angle θ of a surface of the insulating layer with water is 20° or more.

7. The solar cell according to claim 1, wherein the second-melting-point material includes a metallic material.

8. The solar cell according to claim 1, wherein the thermal-fluidization onset temperature $T_1$ of the first-melting-point material is 250° C. or lower, and the thermal-fluidization onset temperature $T_2$ of the second-melting-point material is higher than 250° C.

9. The solar cell according to claim 1, wherein a melting point of the first-melting-point material is identical to the thermal fluidization onset temperature $T_1$.

10. A solar cell module, comprising: a photoelectric conversion section; and a collecting electrode on one main surface of the photoelectric conversion section, wherein the collecting electrode includes a first electroconductive layer and a second electroconductive layer in this order from a photoelectric conversion section side, and further includes an insulating layer between the first electroconductive layer and the second electroconductive layer, wherein an opening section is formed in the insulating layer;

the first electroconductive layer is covered with the insulating layer;

the first electroconductive layer includes a first-melting-point material and a second-melting-point material a thermal-fluidization onset temperature $T_1$ of the first-melting-point material is lower than a heat-resistant temperature of the photoelectric conversion section, and a thermal-fluidization onset temperature $T_2$ of the second-melting-point material is higher than $T_1$, and a part of the second electroconductive layer is conductively connected with the first electroconductive layer through the opening section of the insulating layer, wherein the first-melting-point material includes a metallic material.

* * * * *